(12) United States Patent
Han et al.

(10) Patent No.: US 11,430,834 B2
(45) Date of Patent: Aug. 30, 2022

(54) DISPLAY DEVICE INCLUDING WHITE ORGANIC LIGHT-EMITTING DEVICE

(71) Applicant: LG Display Co., Ltd., Seoul (KR)

(72) Inventors: Mi-Young Han, Paju-si (KR); Jung-Keun Kim, Seoul (KR); Tae-Shick Kim, Hwaseong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 65 days.

(21) Appl. No.: 17/129,359

(22) Filed: Dec. 21, 2020

(65) Prior Publication Data

US 2021/0202598 A1 Jul. 1, 2021

(30) Foreign Application Priority Data

Dec. 27, 2019 (KR) .......................... 10-2019-0176811

(51) Int. Cl.
*H01L 27/32* (2006.01)
*H01L 51/52* (2006.01)

(52) U.S. Cl.
CPC ...... *H01L 27/3213* (2013.01); *H01L 27/3209* (2013.01); *H01L 27/3216* (2013.01); *H01L 51/5215* (2013.01); *H01L 2251/306* (2013.01); *H01L 2251/308* (2013.01)

(58) Field of Classification Search
CPC ............. H01L 27/3209; H01L 27/3213; H01L 51/5206–5218
See application file for complete search history.

(56) References Cited

U.S. PATENT DOCUMENTS

2017/0338289 A1\* 11/2017 Seo ..................... H01L 51/5281

FOREIGN PATENT DOCUMENTS

KR 10-2020-0001045 A 1/2020

\* cited by examiner

*Primary Examiner* — Daniel P Shook
(74) *Attorney, Agent, or Firm* — Morgan, Lewis & Bockius LLP

(57) ABSTRACT

A display device, includes a substrate having at least two colored subpixels and a white subpixel separately arranged thereon; a first anode having a first thickness at each of the colored subpixels on the substrate; a second anode, having a thickness smaller than the first thickness, at the white subpixel on the substrate; an organic stack comprising a first stack having a first blue emission layer, a second stack having a second blue emission layer, and a third stack having at least one of emission layers having a longer wavelength than the blue emission layers, which are provided in sequence on the first anode in the colored subpixel and the second anode in the white subpixel; a cathode over the organic stack; and a compensation pattern between the second anode and the substrate.

17 Claims, 17 Drawing Sheets

Anode 2200 Å

Anode 1200 Å

Anode 500 Å

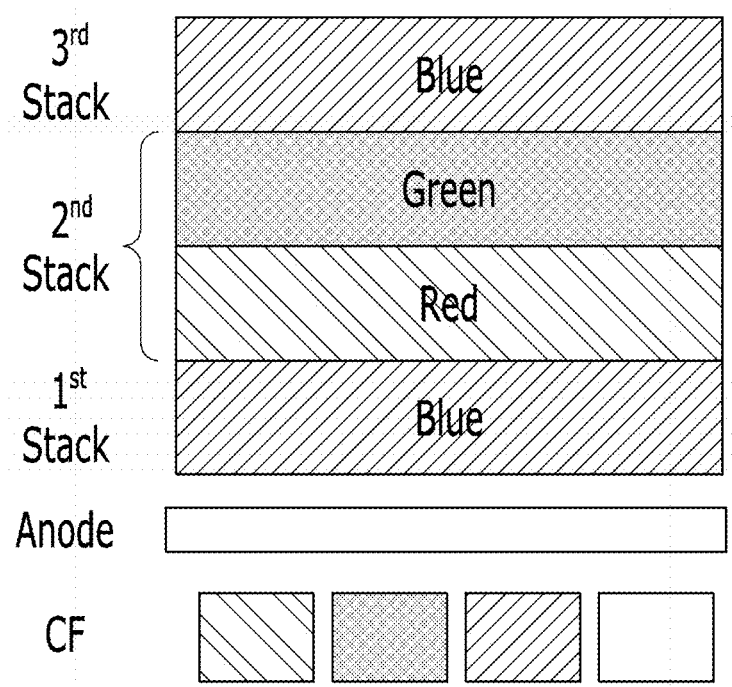

DISPLAY DEVICE INCLUDING WHITE ORGANIC LIGHT-EMITTING DEVICE

This application claims the benefit of Korean Patent Application No. 10-2019-0176811, filed on Dec. 27, 2019, which is hereby incorporated by reference as if fully set forth herein.

BACKGROUND

Technical Field

The present disclosure relates to a light-emitting device, and more particularly, to a display device that enables an improvement in efficiency and widens a narrow viewing angle by including a tandem-structured white organic light-emitting device and changing the structure thereof.

Discussion of the Related Art

As the information age has fully arrived in recent years, the field of displays that visually display electrical signals containing information has rapidly developed. Accordingly, various flat display devices having excellent features, such as thinness, light weight, and low power consumption, have been developed, and have rapidly replaced existing cathode ray tubes (CRTs).

Specific examples of such flat display devices may include a liquid crystal display (LCD) device, a plasma display panel (PDP) device, a field emission display (FED) device, an organic light-emitting display (OLED) device, a quantum dot display device, and so on.

Among them, the organic light-emitting display device is considered a competitive application because it does not require a separate light source and enables realization of compact device design and vivid color display.

Meanwhile, the organic light-emitting display device includes a plurality of subpixels, with an organic light-emitting device provided in each of the subpixels to emit light without a separate light source.

A tandem device constituting an organic layer and an emission layer in common without a deposition mask in the configuration of the organic light-emitting device is advantageous in terms of the processability thereof, and has been studied.

However, a display device including a tandem device having a plurality of stacks includes a plurality of emission layers exhibiting different resonance characteristics, resulting in a narrow viewing angle that causes color defects to be observed when a viewer tilts a screen at a certain angle. Hence, efforts are being made to solve this issue.

SUMMARY

Accordingly, embodiments of the present disclosure are directed to a display device including a white organic light-emitting device that substantially obviates one or more problems due to limitations and disadvantages of the related art.

An object of the present disclosure is to provide a white organic light-emitting device that can increase luminous efficiency and exhibit improved luminance characteristics by changing the configuration thereof, and can also widen a narrow viewing angle, and a display device using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device can improve color efficiency and prevent a narrow viewing angle by separating a colored subpixel and a white subpixel from each other for different light emission structures and by changing a stack structure.

In accordance with an aspect of the present disclosure, there is provided a display device that includes a substrate having at least two colored subpixels and a white subpixel separately arranged thereon, a first anode having a first thickness provided in each of the colored subpixels on the substrate, a second anode, having a thickness smaller than the first thickness, provided in the white subpixel on the substrate, an organic stack including a first stack having a first blue emission layer, a second stack having a second blue emission layer, and a third stack having at least one of emission layers having a longer wavelength than the blue emission layers, which are provided in sequence on the first anode in the colored subpixel and the second anode in the white subpixel, a cathode provided on the organic stack, and a compensation pattern provided between the second anode and the substrate.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the various principles of the disclosure. In the drawings:

FIGS. 7A and 7B are cross-sectional views schematically illustrating a display device according to a fourth experimental example, and a contour map thereof;

DETAILED DESCRIPTION

Figure 1:
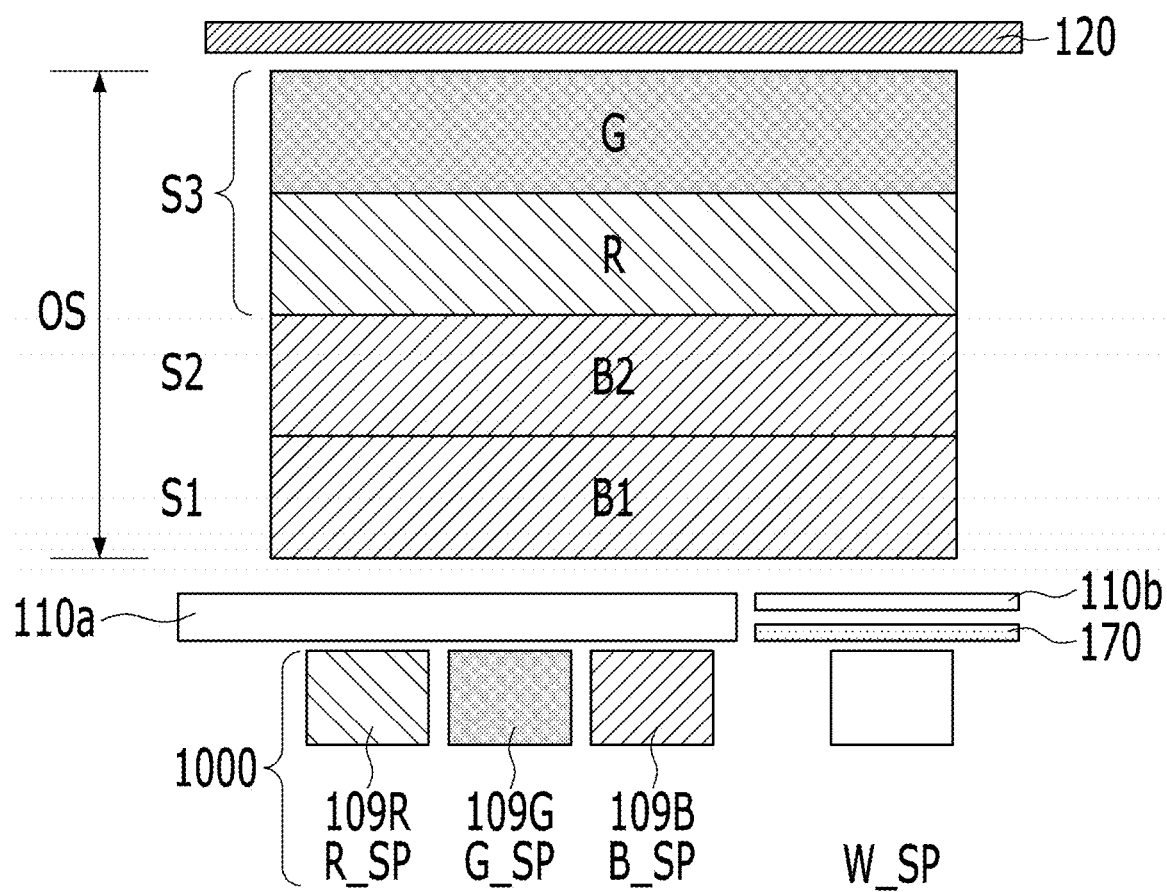
FIG. 1 is a cross-sectional view schematically illustrating a display device according to a first embodiment of the present invention.

Reference will now be made in detail to embodiments of the present disclosure, examples of which are illustrated in the accompanying drawings. Wherever possible, the same reference numbers will be used throughout the drawings to refer to the same or like parts. In the following description, a detailed description of known functions and configurations incorporated herein will be omitted when the same may make the subject matter of the present invention rather unclear. The names of components used herein are selected in consideration of ease of preparation of the specification, and may be different from the names of parts of actual products.

In the drawings for explaining the various embodiments of the present invention, the illustrated shape, size, ratio, angle, and number are given merely by way of example, and thus do not limit the disclosure of the present invention. Throughout the specification, the same reference numerals designate the same constituent elements. In the following description, a detailed description of known functions and configurations incorporated herein will be omitted when the same may make the subject matter of the present invention rather unclear. The terms "comprises," "includes," and/or "has" used herein do not preclude the presence or addition of other elements unless used along with the term "only". The singular forms "a," "an," and "the" are intended to include the plural forms as well, unless the context clearly indicates otherwise.

The components involved in the various embodiments of the present invention should be interpreted as including an error range even if there is no explicit description thereof.

In the various embodiments of the present invention, when describing positional relationships, for example, when the positional relationship between two parts is described using "on", "above", "below", "beside", or the like, one or more other parts may be located between the two parts, unless the term "directly" or "closely" is used.

In the various embodiments of the present invention, when describing temporal relationships, for example, when the temporal relationship between two actions is described using "after", "subsequently", "next", "before", or the like, the actions may not occur in immediate succession, unless the term "directly" or "just" is used.

In the various embodiments of the present invention, although terms such as, for example, "first" and "second" may be used to describe various elements, these terms are merely used to distinguish the same or similar elements from each other. Therefore, in the specification, an element modified by "first" may be the same as an element modified by "second" without exceeding the technical scope of the present invention unless otherwise mentioned.

The respective features of the various embodiments of the present invention may be partially or fully coupled to and combined with each other, and can be technically linked and driven in various manners. These embodiments may be performed independently of each other, or may be performed in association with each other.

Meanwhile, the electroluminescence (EL) spectrum used herein is calculated by multiplying (1) a photoluminescence (PL) spectrum, which reflects the inherent characteristics of a luminescent material, such as a dopant material or a host material, included in an organic emission layer, by (2) an outcoupling/emittance spectrum curve, which is determined according to the structure and optical characteristics of an organic light-emitting device, including the thicknesses of organic layers such as an electron transport layer.

Figure 2:
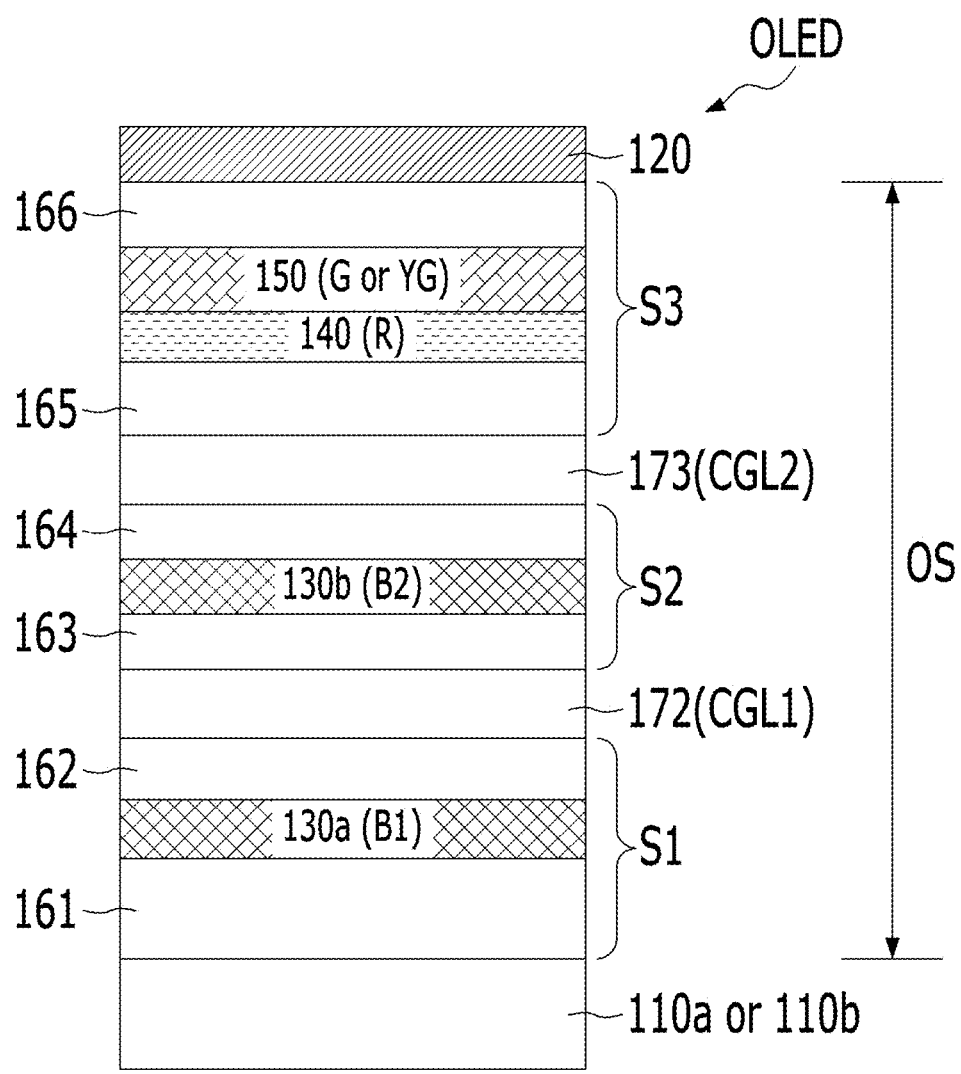
FIG. 2 is a cross-sectional view illustrating a specific structure of the white organic light-emitting device of FIG. 1.

FIG. 1 is a cross-sectional view schematically illustrating a display device according to a first embodiment of the present invention. FIG. 2 is a cross-sectional view illustrating a specific structure of the white organic light-emitting device of FIG. 1.

As illustrated in FIG. 1, the display device according to the first embodiment of the present invention includes a substrate 1000 having at least two colored subpixels R_SP, G_SP, and B_SP and a white subpixel W_SP separately arranged thereon, a first anode 110a having a first thickness t1 provided at each of the colored subpixels R_SP, G_SP, and B_SP of the substrate, a second anode 110b having a second thickness t2, which is smaller than the first thickness, provided at the white subpixel W_SP of the substrate, an organic stack OS including a first stack S1 having a first blue emission layer B1, a second stack S2 having a second blue emission layer B2, and a third stack S3 having at least one of emission layers R and G having a longer wavelength than the blue emission layers, the first stack, the second stack and the third stack are provided in sequence on the first anode 110a at the colored subpixel R_SP, G_SP, or B_SP and the second anode 110b at the white subpixel W_SP, a cathode 120 provided over the organic stack, and a compensation pattern 170 provided between the substrate 1000 and the second anode 110b.

The display device of the present invention is primarily characterized in that the first and second stacks S1 and S2 emitting blue light are adjacent to the first and second anodes 110a and 110b, and the third stack S3, emitting longer-wavelength light than the blue light, is adjacent to the cathode 120 in order to improve luminous efficiency without changing any material within the organic light-emitting device.

In a display device including two blue emission stacks and a longer-wavelength emission stack, when the longer-wavelength emission stack is positioned as an intermediate stack between an anode and a cathode, the efficiency of longer-wavelength light emission may decrease. However, when the third stack S3 is provided as a longer-wavelength emission stack adjacent to the cathode as in the display device of the present invention, the efficiency of longer-wavelength light emission can remarkably increase without changing the material. Therefore, the display device of the present invention has an advantage of increasing color efficiency of longer-wavelength light merely by changing the stacks, without changing green, red, or yellow-green dopants or without additional material development.

A specific example of the configuration of the organic stack will be described with reference to FIG. 2.

The organic stack OS is disposed between the first or second anode 110a or 110b and the cathode 120, and includes the first to third stacks S1, S2, and S3 separated from each other by charge generation layers 172 and 173 therebetween.

The charge generation layers 172 and 173, for example, may be formed by stacking a p-type charge generation layer and an n-type charge generation layer, or may be formed as a single layer including both p-type and n-type dopants of a common host. The charge generation layers 172 and 173 function to supply sufficient holes and electrons to the stacks S1, S2, and S3 adjacent thereto.

The first stack S1 includes a first hole transport layer 161, a first blue emission layer 130a (B1), and a first electron transport layer 162. The second stack S2 includes a second hole transport layer 163, a second blue emission layer 130b (B2), and a second electron transport layer 164.

The third stack S3 is used as a longer-wavelength emission layer, and includes a third hole transport layer 165, a red emission layer 140, a green or yellow-green emission layer 150, and a third electron transport layer 166.

In the above-mentioned first to third stacks S1, S2, and S3, the first to third hole transport layers 161, 163, and 165 and the first to third electron transport layers 162, 164, and 166 may be provided as multiple layers in order for at least one or all thereof to increase hole or electron transport efficiency in the corresponding stack or to limit carriers to the emission layer. In this case, each of the multiple layers may be made of the same material as the layer adjacent thereto or may contain a different dopant component in a small amount, or the multiple layers may be made of a single material.

The first and second blue emission layers 130a and 130b of the first and second stacks S1 and S2 may include the same host and the same dopant. Alternatively, the first and second blue emission layers 130a and 130b may include different dopants within the range of the same color, such as deep blue or light blue, in consideration of the colors intended to be displayed in the display device, the dopants having a difference in luminescence peak within a wavelength of approximately 10 nm to 45 nm.

Examples of the longer-wavelength emission layer provided in the third stack S3 include a red emission layer 140 and a green or yellow-green emission layer 150. By inverting the configuration of FIG. 2, after the green or yellow-green emission layer 150 is first formed, the red emission layer 140 may be formed thereon.

The white light emission realized in combination of the stacks in the organic light-emitting device OLED largely depends on the green or yellow-green emission layer 150, among the red emission layer 140 and the green or yellow-green emission layer 150. Thus, the yellow-green emission layer 150 may be relatively thicker than the first and second blue emission layers 130a and 130b and the red emission layer 140.

The first and second blue emission layers 130a and 130b have a luminescence peak at a wavelength of 445 nm to 490 nm. The green or yellow-green emission layer 150 has a luminescence peak at a wavelength of 510 nm to 590 nm. The red emission layer 140 has a luminescence peak at a wavelength of 610 nm to 640 nm.

Blue emissive materials developed to date have luminous efficiency lower than emissive materials of other colors due to material limitations pertaining to blue dopants. For this reason, the display device of the present invention includes two blue emission stacks in the organic light-emitting device OLED for realizing white light in order to compensate for the difference in efficiency with the longer-wavelength emission stack.

In order to increase the efficiency of the multi-stacked display device, an additional emission stack may be provided in addition to the illustrated example. However, the display device of the present invention is preferably configured such that the longer-wavelength emission stack is close to the cathode 120 to this increase the luminous efficiency of the longer-wavelength emission stack. In particular, the present inventors have confirmed that, in the triple-stack structure, the efficiency of long-wavelength light emission is significantly increased when the first blue emission stack, the second blue emission stack, and the longer-wavelength emission stack are provided between the first and/or second anodes 110a and/or 110b and the cathode 120.

Meanwhile, the display device according to the first embodiment of the present invention is secondarily characterized in that the second anode 110b in the white subpixel W_SP has a different thickness from the first anode 110a in each colored subpixel R_SP, G_SP, or B_SP and the compensation pattern 170 is provided beneath the second anode 110b.

The second anode 110b in the white subpixel W_SP is thinner than the first anode 110a in each colored subpixel R_SP, G_SP, or B_SP, with the consequence that the luminous efficiency of light passing through the organic stack OS in the white subpixel W_SP is higher than that in the colored subpixels. In addition, the compensation pattern 170 may prevent variability across viewing angles when the longer-wavelength emission layer provided in the third stack S3 allows the efficiency of long-wavelength light emission to increase. To this end, the compensation pattern 170 is made of a material having a small variation in refractive index of 0.1 or less and a small extinction coefficient k of 0.01 or less for visible light. In addition, the compensation pattern 170 has a refractive index of 1.9 to 2.0, thereby differing only slightly in refractive index at the interface with the second anode 110b.

The compensation pattern 170 is provided to adjust the optical properties of the white subpixel W_SP, and may or may not be conductive. However, the compensation pattern 170 may be made of a material that satisfies the above conditions in terms of refractive index and extinction coefficient. In the following experimental examples, the present inventors conducted an experiment using a silicon nitride film. However, the material of the compensation pattern 170 is not limited to the material of the silicon nitride film, and may be changed to other materials as long as it satisfies the conditions of the refractive index and extinction coefficient in the wavelength band of visible light.

For example, a silicon oxide film may be used for the compensation pattern 170 by adjusting the ratio of oxygen and silicon, and the compensation pattern 170 may be applied to the structure of the display device of the present invention described above in order to prevent a variation in refractive index and extinction coefficient in a wavelength band of visible light.

In addition, when the compensation pattern 170 includes a silicon nitride film, the silicon nitride film may consist of a plurality of layers having different ratios of silicon and nitrogen. In some cases, the compensation pattern 170 may also be formed by stacking a silicon nitride film and a layer made of a different material having a refractive index and extinction coefficient similar to those of the silicon nitride film.

A color variation across viewing angles in the white subpixel W_SP may be compensated for and reduced by the compensation pattern 170 provided therein.

The first and second anodes 110a and 110b are used as transparent electrodes, and the cathode 120 is used as a reflective electrode. Accordingly, light is emitted through the first and second anodes 110a and 110b while being subjected to resonance in the organic stack OS, in which case the relatively thin second anode 110b is effective.

The compensation pattern 170 is effective when it is thicker than the second anode 110b. The present inventors have confirmed through experiments that the compensation pattern 170 is most effective when it is approximately twice as thick as the second anode 110b.

When the second anode 110b has a thickness of 500 Å to 600 Å and the compensation pattern 170 has a thickness of 900 Å to 1000 Å, the color variation across viewing angles may decrease.

In this case, the first anode 110a may be at least twice as thick as the second anode 110b, and may be thinner than the total thickness of the second anode 110b and the compensation pattern 170.

Although FIG. 1 illustrates the first anode 110a in a single form with respect to the colored subpixels R_SP, G_SP, and B_SP, this is to indicate that the first anodes 110a in the colored subpixels R_SP, G_SP, and B_SP have the same thickness. For driving the individual colored subpixels R_SP, G_SP, and B_SP, the first anodes 110a are provided in the respective colored subpixels R_SP, G_SP, and B_SP (see FIG. 3).

The first and second anodes 110a and 110b may be used as transparent oxide electrodes containing at least two of indium (In), tin (Sn), and zinc (Zn), and the cathode 120 may contain reflective metal. For example, the first and second anodes 110a and 110b may be made of the same material such as ITO or IZO and may have different thicknesses, and the cathode 120 may be a reflective electrode containing Al, Al alloy, Ag, Ag alloy, Mg, Mg alloy, APC (Ag—Pd—Cu), and/or the like.

The colored subpixels R_SP, G_SP, and B_SP of the substrate 1000 may include a red filter 109R, a green filter 109G, and a blue filter 109B, respectively.

The organic stack OS of FIG. 2 includes: a first hole transport layer 161 between the first and second anodes 110a and 110b and the first blue emission layer 130a; a first electron transport layer 162, a first charge generation layer 172, and a second hole transport layer 163 between the first and second blue emission layers 130a and 130b; a second electron transport layer 164, a second charge generation layer 173, and a third hole transport layer 165 between the second blue emission layer 130b and the red emission layer 140; and a third electron transport layer 166 between the green emission layer 150 and the cathode 120. Here, the first hole transport layer 161 is referred to as a first common layer CML1, the first electron transport layer 162, the first charge generation layer 172, and the second hole transport layer 163 are referred to as a second common layer CML2, the second electron transport layer 164, the second charge generation layer 173, and the third hole transport layer 165 are referred to as a third common layer CML3, and the third electron transport layer 166 is referred to as a fourth common layer CML4, since these layers are formed in common in each subpixel. The individual common layers are continuously formed in the plurality of subpixels provided on the substrate 1000.

The first to fourth common layers CML1, CML2, CML3, and CML4 may have different thicknesses so as to adjust the positions of the emission layers 130a, 130b, 140, and 150 in the stack. Thus, the thicknesses of the first to third hole transport layers 161, 163, and 165 may differ from the thicknesses of the first to third electron transport layers 162, 164, and 166.

In the organic light-emitting device of the present invention, the third stack S3 includes the longer-wavelength emission layers 140 and 150. In order to provide an effective luminescent zone in the red emission layer 140 and the green or yellow-green emission layer 150, the third common layer between the second blue emission layer 130b and the red emission layer 140 may be thinner than the second common layer between the first and second blue emission layers 130a and 130b.

Meanwhile, in the (white) organic light-emitting device OLED of the present invention illustrated in FIG. 2, each of the emission layers 130a, 130b, 140, and 150 is provided in the form of an open mask having an open region in the active region of the substrate 1000, without having an FMM deposition mask. Thus, each of the emission layers 130a, 130b, 140, and 150 may be continuously formed for the individual subpixels.

Hereinafter, a detailed configuration of the display device of the present invention will be described with reference to FIG. 3.

Figure 3:
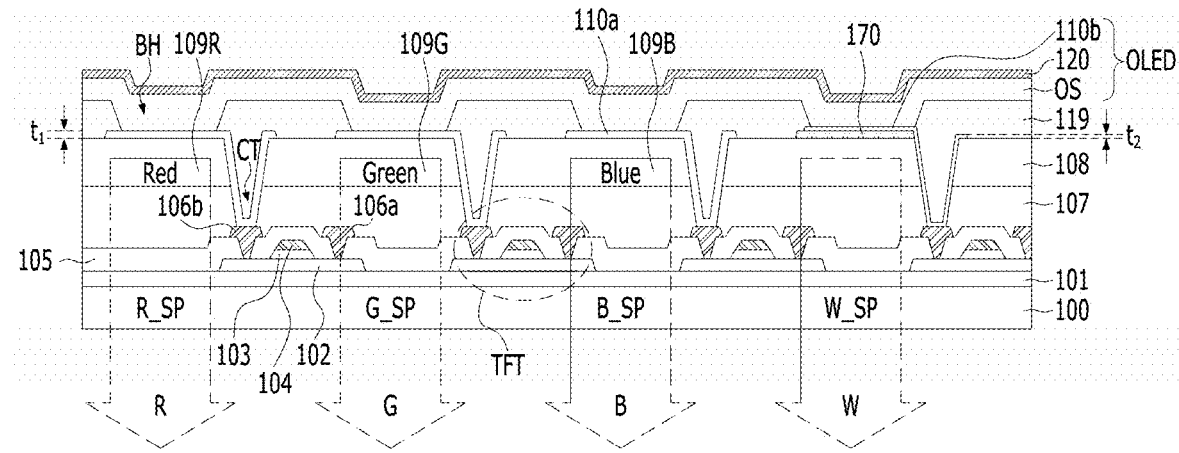
FIG. 3 is a cross-sectional view illustrating the display device of the present invention in association with the lower configuration of the organic light-emitting device.

FIG. 3 is a cross-sectional view illustrating the display device of the present invention in association with the lower configuration of the organic light-emitting device.

As illustrated in FIG. 3, the display device of the present invention may include a substrate 100 having a plurality of colored and white subpixels R_SP, G_SP, B_SP, and W_SP, a white organic light-emitting device OLED, which is described above with reference to FIG. 2, provided in common on the substrate 100, thin film transistors TFT provided in the respective subpixels and respectively connected to first anodes 110a and a second anode 110b of the white organic light-emitting device OLED, and color filters 109R, 109G, and 109B provided in the respective colored subpixels R_SP, G_SP, and B_SP beneath the first anodes 110a.

Although the illustrated example has been described as including red, green, and blue subpixels as the colored subpixels, the present invention is not limited thereto. For example, in place of the combination of the red, green, and blue subpixels, a cyan subpixel, a magenta subpixel, and a yellow subpixel may be combined for white display.

Each of the thin film transistors TFT may include, for example, a semiconductor layer 102 formed on a buffer layer 101, a gate insulating layer 103 and a gate electrode 104 formed in sequence while partially overlapping the semiconductor layer 102, and source and drain electrodes 106a and 106b connected to both sides of the semiconductor layer 102.

As illustrated in FIG. 3, an interlayer insulating layer 105 may be further formed between the gate insulating layer 103, the gate electrode 104, and the source/drain electrodes 106a/106b. In some cases, the interlayer insulating layer 105 may be removed to form the gate electrode 104 and the source and drain electrodes 106a and 106b on the same layer, thereby applying a coplanar structure to the thin film transistor.

The semiconductor layer 102 may be made of, for example, oxide semiconductor, amorphous silicon, polycrystalline silicon, or a combination of two or more thereof.

The drain electrode 106b of the thin film transistor TFT provided in each of the subpixels R_SP, G_SP, B_SP, and W_SP may be connected to a contact hole CT region provided in the associated first anode 110a and first and second passivation layers 107 and 108.

The first passivation layer 107 is primarily provided to protect the thin film transistor TFT, and the color filters 109R, 109G, and 109B may be provided on the first passivation layer 107.

When the subpixels consist of a red subpixel, a green subpixel, a blue subpixel, and a white subpixel, the color filters consist of first to third color filters 109R, 109G, and 109B provided in the remaining subpixels excluding the white subpixel W_SP. The white light emitted through the first anodes 110a passes through the color filters for each wavelength. As illustrated in the drawing, the second passivation layer 108 on the second anode 110b may be made of an organic material that allows the planarization thereof, so as to minimize a step between the upper surface, which covers the first to third color filters 109R, 109G, and 109B of the adjacent colored subpixels R_SP, G_SP, and B_SP, and the upper surface of the white subpixel W_SP. In some cases, when the second passivation layer 108 is formed to have a uniform thickness over each region, a transparent organic member, having a thickness equal or similar to the thickness of the first to third color filters 109R, 109G, and 109B, may be further formed corresponding to the white subpixel W_SP.

The second passivation layer 108 is formed beneath the first and second anodes 110a and 110b to cover the first to third color filters 109R, 109G, and 109B. The first and second anodes 110a and 110b are formed on the surface of the second passivation layer 108, except for the contact hole CT.

The white organic light-emitting device OLED includes a first or second transparent anode 110a or 110b, a cathode 120 used as a reflective electrode facing the first or second transparent anode 110a or 110b, and an organic stack OS between the first or second transparent anode 110a or 110b and the cathode 120. The organic stack OS includes a first stack S1 having a first blue emission layer B1 (130a), a second stack S2 having a second blue emission layer B2 (130b), and a third stack S3, having emission layers, having a longer wavelength than the blue emission layers, such as a red emission layer 140 and a green (G) or yellow-green (YG) emission layer 150.

Reference numeral 119, which is not described herein, refers to banks, and reference numeral BH refers to a bank hole between the banks. Since light is radiated on an open region through the bank hole, the bank hole is defined as an emission unit of each subpixel.

The display device of FIG. 3 is an example of a bottom-emission-type display device. In some cases, the display device may also be a top-emission-type display device formed by inverting the white organic light-emitting device OLED of FIG. 2 and providing the color filters 109R, 109B, and 109B at positions adjacent to the upper first and second anodes 110a and 110b.

Alternatively, the display device of FIG. 3 may include a transparent organic light-emitting device implemented in such a manner that the color filters are removed or optionally provided in a required region and both of the first and second anodes 110a and 110b and the cathode 120 are used as transparent electrodes.

Figure 4:
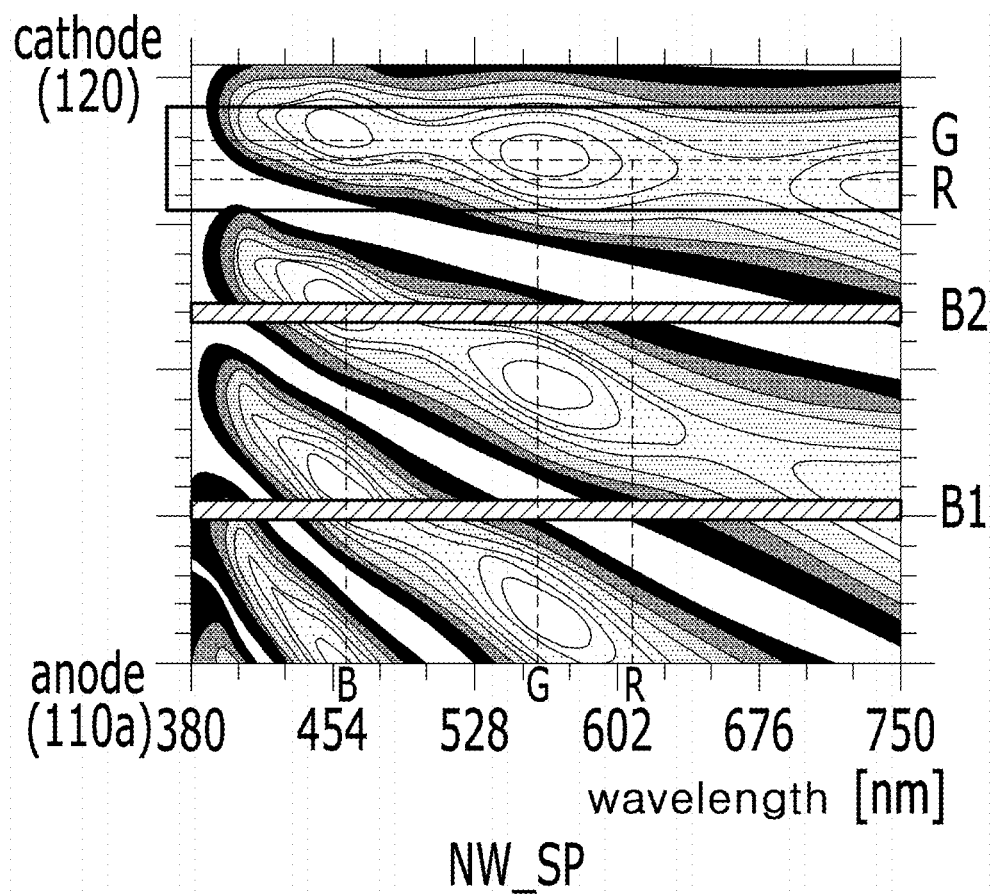
FIG. 4 is a contour map of non-white subpixels of the display device of the present invention.
Figure 5:
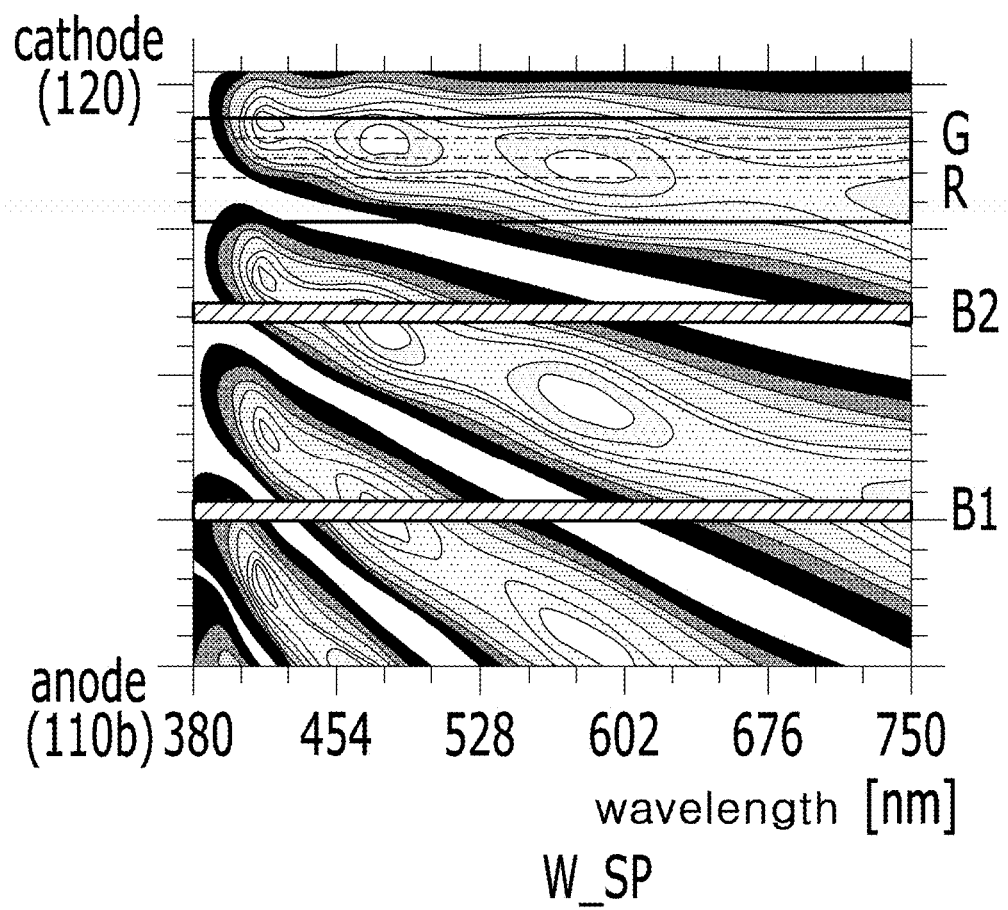
FIG. 5 is a contour map of a white subpixel of the display device of the present invention.

FIG. 4 is a contour map of the non-white subpixels of the display device of the present invention. FIG. 5 is a contour map of the white subpixel of the display device of the present invention.

As illustrated in FIGS. 4 and 5, the non-white (colored) subpixels NW_SP (R_SP, G_SP, and B_SP) and the white subpixel W_SP are not equal in the contour maps thereof due to the difference in thickness between the first and second anodes 110a and 110b and additionally based on whether a compensation pattern 170 is provided therein. However, in each of the non-white subpixels NW_SP and the white subpixel W_SP, the first and second blue emission layers B1 and B2 of the first and second stacks to emit optimal blue light and the red and green emission layers R and G to emit optimal red and green light may be provided in the same position between the upper surfaces of the first and second anodes 110a and 110b the lower surface of the cathode 120.

The common layer between the second blue emission layer and the red emission layer R of the longer-wavelength emission stack may be thicker than the common layer between the first and second blue emission layers B1 and B2. This is because the distance between the emission layers of the second and third stacks is adjusted by disposing the longer-wavelength emission stack adjacent to the cathode.

FIGS. 4 and 5 illustrate the display device having the configuration illustrated in FIGS. 1 to 3, in which the first anode 110a has a thickness of 1200 Å and the second anode 110b has a thickness of 500 Å.

The non-white subpixels NW_SP are subpixels that include the color filters 109R, 109G, and 109B, respectively, to emit light having a corresponding wavelength and absorb light having remaining wavelengths. Therefore, the non-white subpixels NW_SP are advantageous in selectively displaying red, green, and blue.

The white subpixel W_SP is a subpixel that mainly affects the luminance of the display device, and does not include a color filter to maximize the emission rate of light. However, the white subpixel W_SP may exhibit a relatively large color variation at different viewing angles, because the white subpixel W_SP does not include a color filter for light emission or a member for absorbing light such as a color filter, and because the thickness of the second anode 110b is reduced. To resolve this issue, a compensation pattern 170 is further provided beneath the second anode 110b. In this case, it is preferable that the compensation pattern 170 have an extinction coefficient of 0.01 or less so as to absorb hardly any light and a variation in refractive index of 0.1 or less in a wavelength band of visible light so that the compensation pattern 170 is located in the direction in which light is emitted, resulting in minimal variation in refractive index at the interface with the second anode 110b.

Hereinafter, in the display device of the present invention, the significance of the second anode 110b having a small thickness in the white subpixel W_SP, which is relatively strongly affected in color by the viewing angle, will be described.

Figure 6A:
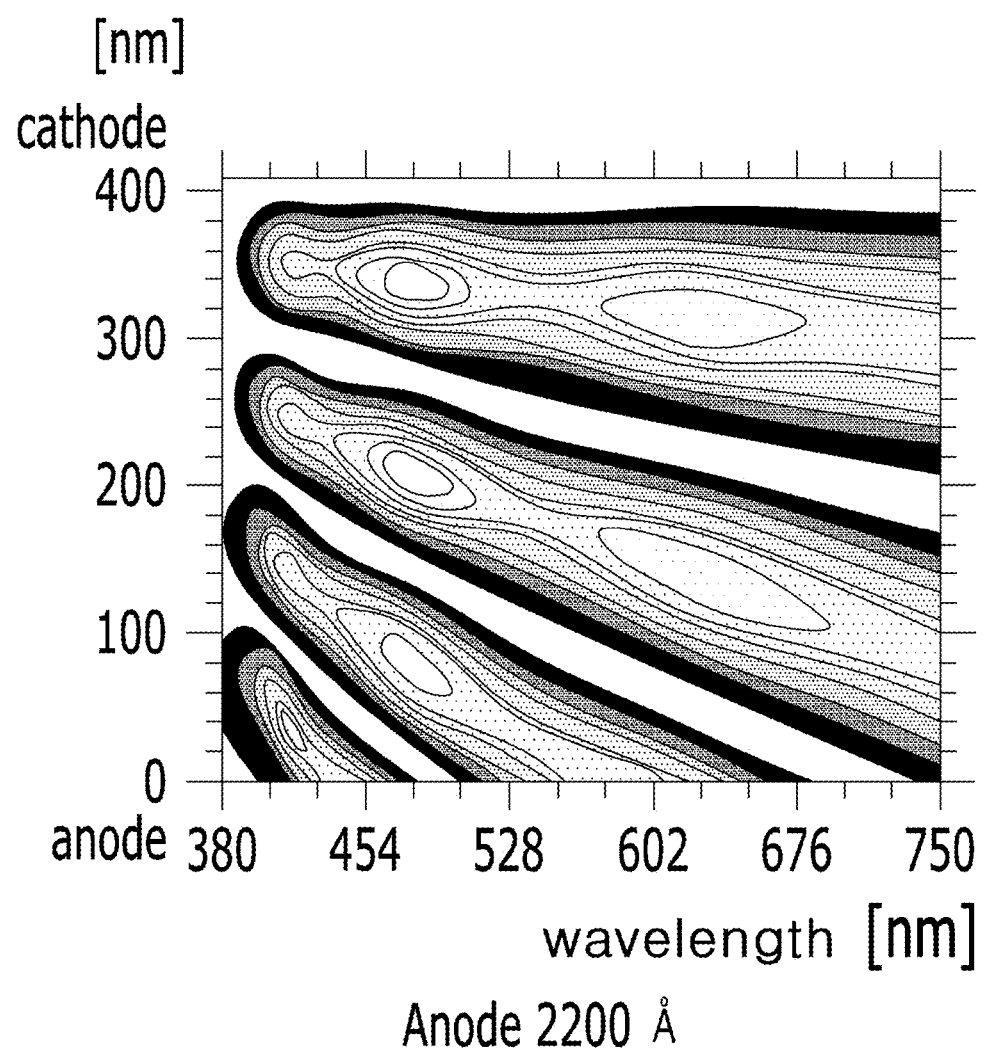
FIGS. 6A to 6C are contour maps when first anodes have different thicknesses in first to third experimental examples having the same organic stack and second anode.
Figure 6B:
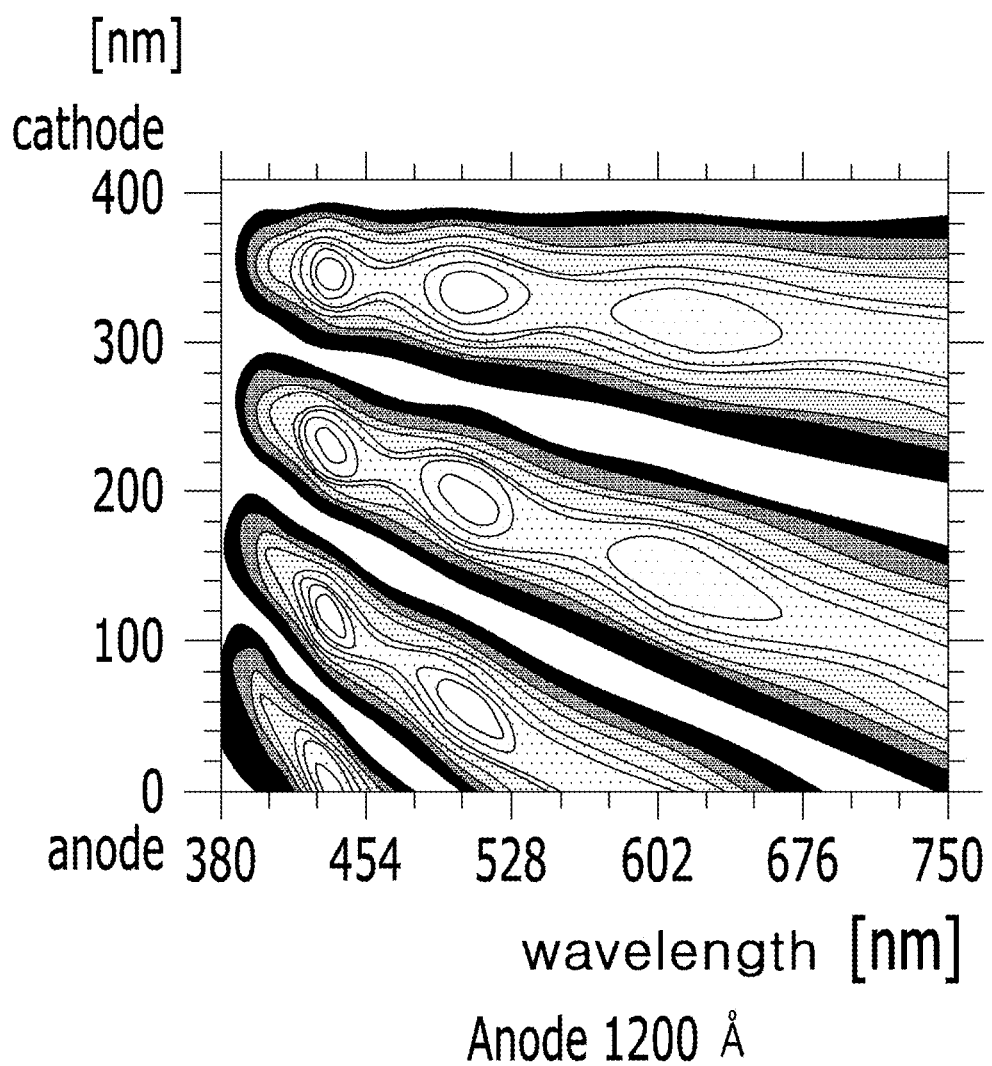
Figure 6C:
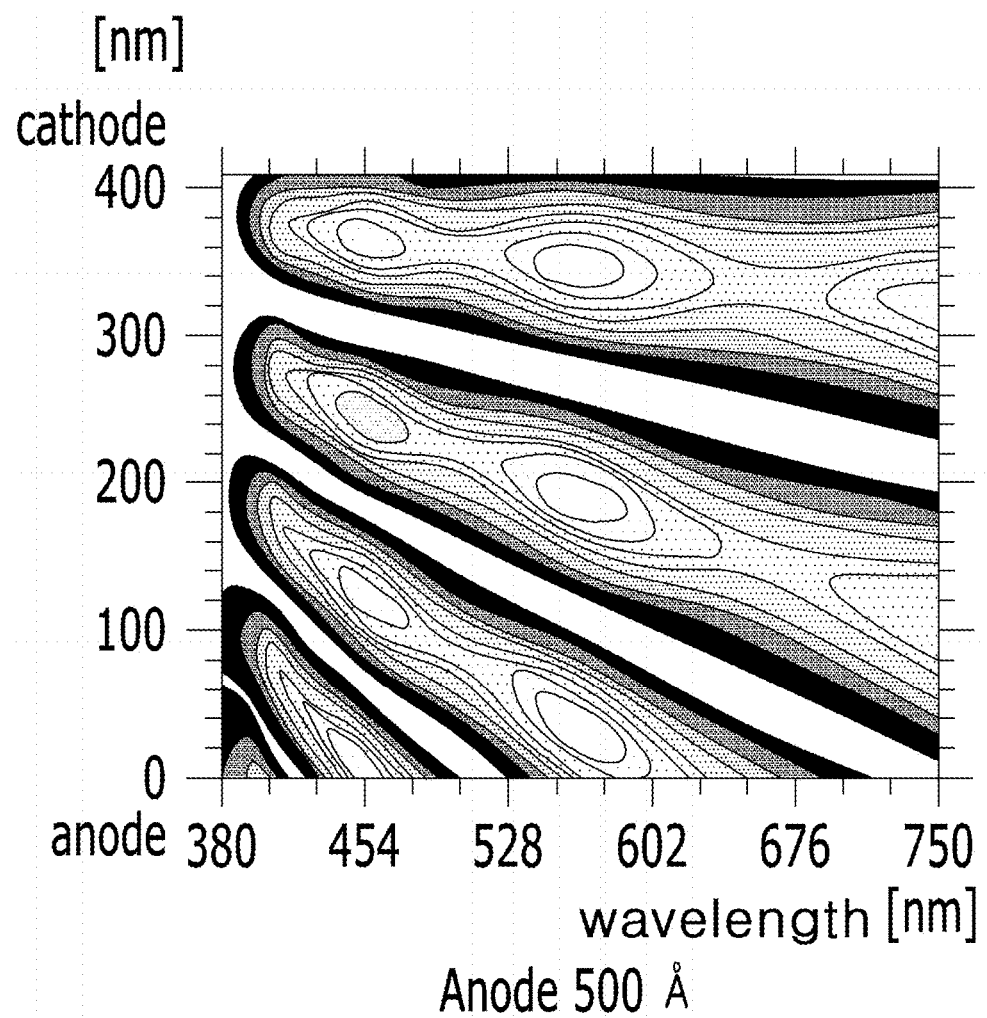

FIGS. 6A to 6C are contour maps when first anodes have different thicknesses in first to third experimental examples Ex1 to Ex3 having the same organic stack and second anode.

In all of the first to third experimental examples Ex1, Ex2, and Ex3 of FIGS. 6A to 6C, the same organic stack OS and cathode 120 illustrated in FIG. 2 are prepared, wherein the organic stack OS includes the first stack S1 having the first blue emission layer, the second stack S2 having the second blue emission layer, and the third stack S3 having the longer-wavelength emission layers R and G, but the anodes have different thicknesses of 2200 Å, 1200 Å, and 500 Å. Unlike in FIG. 5, no compensation pattern is provided under the organic stacks and the anodes.

In the first to third experimental examples Ex1, Ex2, and Ex3, the organic stacks OS have the same thickness, and in each thereof, the first stack may be formed at a distance of about 150 nm to 180 nm from the upper surface of the anode, the second stack may be formed next to the first stack at a distance of about 260 nm to 300 nm from the upper surface of the anode, and the third stack may be formed between the second stack and the cathode. The total thickness of the organic stack OS is 3800 Å to 4300 Å (380 nm to 430 nm).

As illustrated in FIG. 6A, in the first experimental example Ex1 in which the thickness of the anode is 2200 Å in the white subpixel, it can be found that the first and second stacks S1 and S2 have a strong yield point at a blue wavelength of approximately 450 nm to 490 nm and that the third stack S3 has a yield point at a longer green and red wavelength of 570 nm to 630 nm. However, the yield point of the third stack is biased because the wavelength is beyond the range of visible light. Hence, the efficiency of red and green light emission may be expected to decrease. In addition, since the anode is thick, specifically 2200 Å, in the first experimental example, the final efficiency of light emission may decrease due to the quantity of light absorbed by the anode itself, which is used as a transparent electrode. In particular, in a structure of the white subpixel dependent on the luminance of the display device, when the anode of the white subpixel has a thickness of 2000 Å or more, the luminance thereof may be significantly reduced.

As illustrated in FIG. 6B, in the second experimental example Ex2 in which the thickness of the anode is 1200 Å in the white subpixel, among a total of four yield points at a wavelength of blue light, a first yield point may not be designed because of the difficulty of separation from the anode, with the consequence that blue emission layers may be provided in a region having second and third yield points. Accordingly, the first blue emission layer may be formed at a distance of approximately 100 nm to 140 nm from the upper surface of the anode, and the second blue emission layer may be formed at a distance of approximately 210 nm to 250 nm from the upper surface of the anode. In addition, the red and green emission layers may be positioned at approximately 300 nm to 350 nm from the upper surface of the anode. With regard to yield points at a wavelength of red and green light in the second experimental example, the red and green emission layers that emit light having an appropriate wavelength may be stably provided at a vertical distance of 300 nm to 350 nm from the upper surface of the anode. In the second experimental example Ex2, the efficiency of the red and green emission layers themselves is high. However, due to the first and second blue emission layers having a selective yield point in a thin region having a relatively large slope, when the viewing angle of the display device changes during tilting thereof, the color variation at a blue wavelength is larger than the color variation at a relatively longer wavelength, resulting in a narrow viewing angle.

As illustrated in FIG. 6C, in the third experimental example Ex3 in which the thickness of the anode is 500 Å in the white subpixel, the first and second blue emission layers may be formed in a region having second and third yield points, specifically, at a distance of 100 nm to 140 nm and a distance of 240 nm to 270 nm from the upper surface of the anode. The red and green emission layers may be positioned at approximately 320 nm to 380 nm from the upper surface of the anode.

In this case, in the third experimental example Ex3, the region having a yield point at a wavelength of blue light has a gentle slope and an increased length compared to the second experimental example Ex2. Thus, it is possible to minimize a color variation across viewing angles, compared to the second experimental example Ex2. Therefore, the third experimental example Ex3 has the advantage of improved viewing angle characteristics compared to the second experimental example.

Meanwhile, in the first and second experimental examples Ex1 and Ex2, the anode is thicker compared to the third experimental example Ex3. Thus, it can be expected that the loss of the quantity of light absorbed by the anode at the emission side of light is relatively large. Since the anode is thicker in the first experimental example, among the first to third experimental examples, the light loss attributable to the anode is expected to be greatest in the white subpixel.

Accordingly, in the display device provided with the same organic stack OS and cathode 120, wherein the organic stack OS includes the first stack S1 having the first blue emission layer, the second stack S2 having the second blue emission layer, and the third stack S3 having the longer-wavelength emission layers R and G, illustrated in FIG. 2, it can be seen that the luminous efficiency increases and the viewing angle characteristics are improved as the anode in the white subpixel is thin.

As will be described later, in order to further improve viewing angle characteristics, the compensation pattern 170 may be further provided beneath the second anode 110b, as illustrated in FIG. 1.

Hereinafter, the fourth experimental example in which the longer-wavelength emission stack is included in the intermediate stack between the anode and the cathode will be described.

Figure 8:
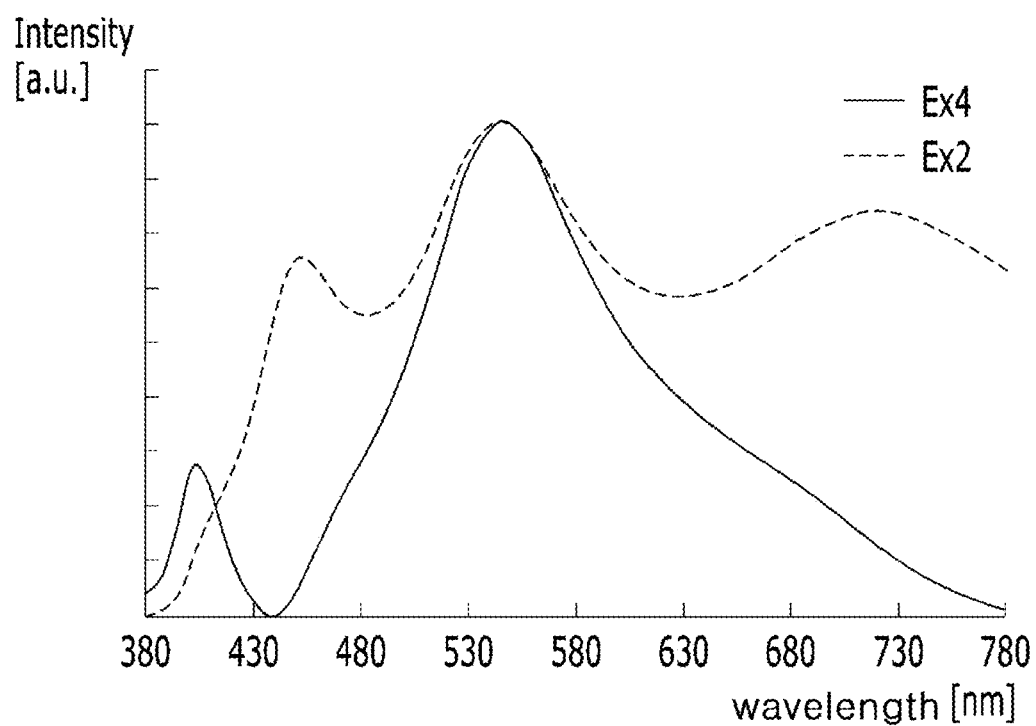
FIG. 8 is a graph illustrating an emittance spectrum when stacks having different types of emission layers are placed at different positions in the display device according to the second and fourth experimental examples.
Figure 9:
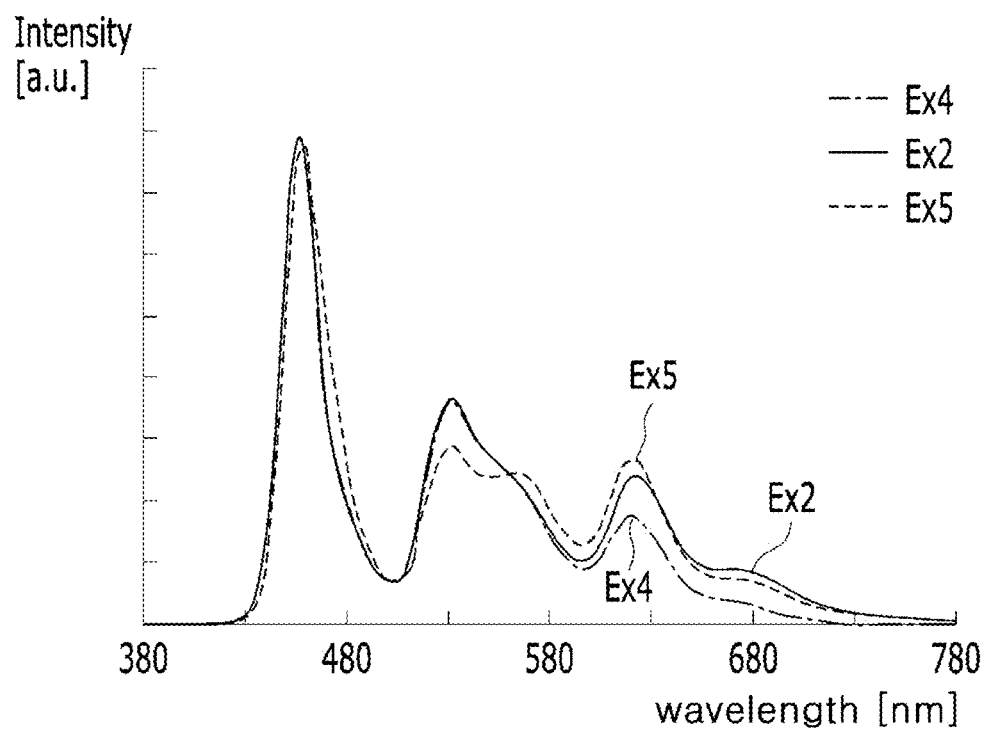
FIG. 9 is a graph illustrating a white spectrum in the second, fourth, and fifth experimental examples.

FIGS. and 7B are cross-sectional views schematically illustrating the display device according to the fourth experimental example Ex4, and the contour map thereof. FIG. 8 is a graph illustrating an emittance spectrum when the stacks having different types of emission layers are placed at different positions in the display device according to the second and fourth experimental examples Ex2 and Ex4. FIG. 9 is a graph illustrating a white spectrum in the second, fourth, and fifth experimental examples Ex2, Ex4, and Ex5.

A comparison of the second, fourth, and fifth experimental examples will be made below with reference to Table 1.

In the second experimental example, the anode having a thickness of 1200 Å is applied to all of the red, green, and blue subpixels and the white subpixel, and the white organic light-emitting device of FIG. 2 is provided. That is, the white organic light-emitting device comprises the organic stack including the first stack having the first blue emission layer, the second stack having the second blue emission layer, and the third stack having the red emission layer R and the green or yellow-green emission layer G or YG (stack structure: B1/B2/RG), followed by the cathode.

As illustrated in FIG. 7A, in the fourth experimental example Ex4, a display device including an organic stack OS and a cathode (not shown) is prepared, wherein the organic stack OS includes a first stack $1^{st}$ Stack having a first blue emission layer Blue, a second stack $2^{nd}$ Stack having longer-wavelength emission layers Red/Green, and a third stack $3^{rd}$ Stack having a second blue emission layer (stack structure: B1/RG/B2). That is, the fourth experimental example differs from the second experimental example in terms of the position of the long-wavelength emission stack.

In the fourth experimental example Ex4, each colored subpixel R_SP, G_SP, or B_SP includes a color filter CF, and the white subpixel W_SP includes a transparent organic member instead of a color filter. In the fourth experimental example Ex4, the anode has a thickness of 1200 Å.

The fifth experimental example Ex5 is the same as the second experimental example Ex2, in terms of the structure of the internal organic stack and the cathode, as illustrated in FIG. 2. In the fifth experimental example Ex5, the first anode 110a having a thickness of 1200 Å is applied to each of the red, green, and blue subpixels R_SP, G_SP, and B_SP, the second anode 110b having a thickness of 500 Å is applied to the white subpixel W_SP, and the compensation pattern 170 is further provided beneath the second anode 110b to compensate for the viewing angle. The internal stack structure in the fifth experimental example is the same as that in the second experimental example (stack structure: B1/B2/RG).

Figure 7B:
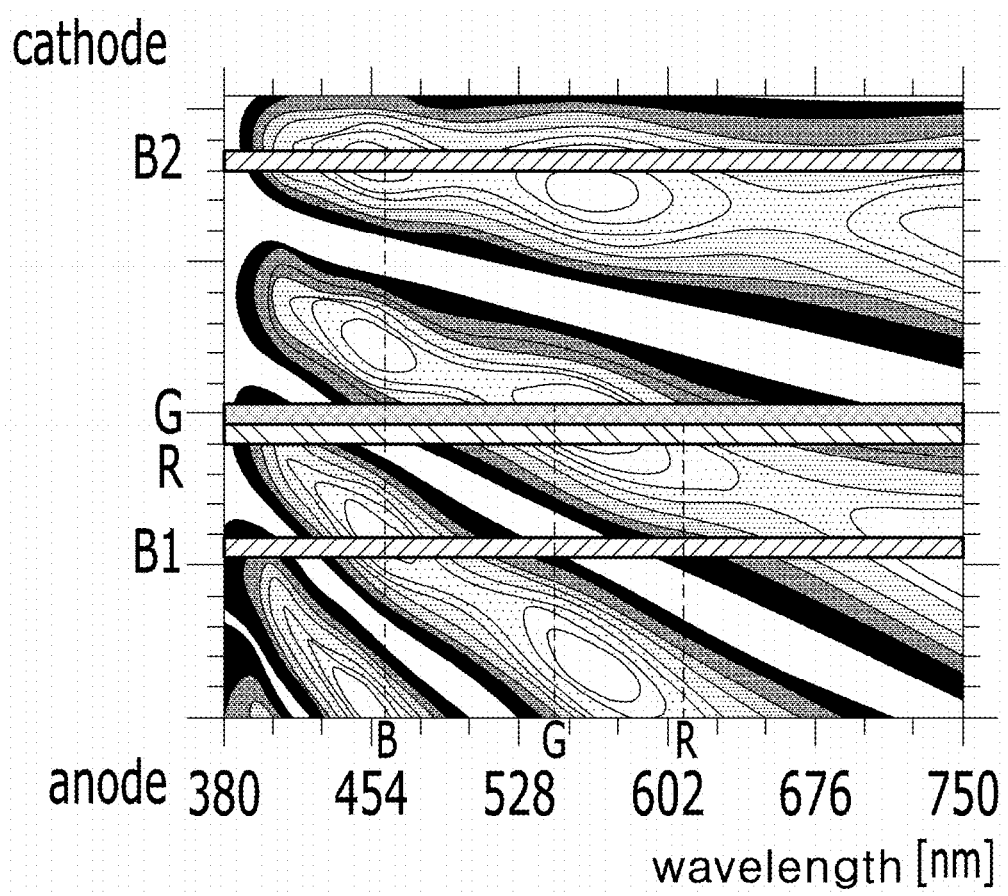

In this case, as illustrated in FIG. 7B, in the fourth experimental example Ex4, the blue emission layers B1 and B2 may be provided in a region having second and fourth yield points at a wavelength of blue light, and the red emission layer R and the green emission layer G may be provided in a region having a second yield point at a long wavelength. That is, as illustrated in FIG. 7A, the first and second blue emission layers B1 and B2 are provided in the respective first and third stacks S1 and S3, and the red and green emission layers as longer-wavelength emission layers are provided in the second stack S2.

Compared to the second experimental example Ex2, the fourth experimental example Ex4, in which the longer-wavelength emission stack as an intermediate stack is positioned between the anode and the cathode, may exhibit stable viewing angle characteristics by securing a relatively gentle region in which blue light is emitted. However, in the fourth experimental example Ex4, as illustrated in FIGS. 8 and 9, the yield point of the longer-wavelength emission stack is mainly biased to the green region, resulting in a decrease in efficiency of red light emission.

Hence, it is necessary to improve the efficiency of red light emission in the display device related to the fourth experimental example Ex4.

On the other hand, in the second and fifth experimental examples Ex2 and Ex5, as illustrated in FIG. 9, the longer-wavelength emission stack is provided close to the cathode by changing the stack structure, thereby increasing the efficiency of light extraction due to the cavity effect. Therefore, the tail of the main and longer wavelength band can also be used for the efficiency of red light emission.

As described above, the second and fifth experimental examples Ex2 and Ex5 can exhibit improved luminous efficiency and luminance by changing only the order of the stacks in the fourth experimental example Ex4, without separately changing any material. However, in the second experimental example Ex2, the color variation Δu'v' is 0.012 at a viewing angle of 60 degrees, as indicated in Table 1, compared to the fourth experimental example Ex4. Accordingly, it can be seen that when the viewer views the display device at different viewing angles, the difference in color visibility is large.

On the other hand, in the fifth experimental example Ex5, it is possible to improve the luminous efficiency and the luminance by changing the order of the stacks, and at the same time, to decrease the color variation across viewing angles because there is no color variation at a viewing angle of 60 degrees compared to the second experimental example Ex2.

That is, in the display device of the present invention illustrated in FIGS. 1 to 3, to which the fifth experimental example Ex5 is applied, it is confirmed through the experiment that the luminous efficiency and the luminance are large and the color variation across viewing angles is small, compared to the second and fourth experimental examples.

The FW efficiency in Table 1 shows the efficiency for each color in full white, which is represented as a value compared to the fourth experimental example Ex4.

The peak efficiency of 25% indicates the efficiency for each color when the display device is driven to have an efficiency of 25% for the maximum peak, which is represented as a value compared to the fourth experimental example Ex 4. Both the full white and the peak efficiency of 25% are improved when the longer-wavelength emission stack is adjacent to the cathode in the stack structure, as in the second and fifth experimental examples Ex2 and Ex5.

The A color coordinate is represented as a color coordinate value compared to the color coordinate for each color in the fourth experimental example Ex4. The smaller the value, the less the difference from the fourth experimental example Ex4. This is the color coordinate value viewed from the front. The second and fifth experimental examples Ex2 and Ex5 do not have a significant difference from the fourth experimental example Ex4.

Rather than the difference between individual color coordinate values in the fourth experimental example Ex4, the smaller the value in the color variation Δu'v' at a viewing angle of 60 degrees, the less the color visibility across viewing angles. The fourth and fifth experimental examples Ex4 and Ex5 exhibit the same color variation, which means that there is no difference in color visibility therebetween. In contrast, since the color variation is 0.012 in the second experimental example Ex2, it may be expected that when the viewing angle is large in the second experimental example Ex2, the viewer feel a large difference in color variation.

Meanwhile, BT709 (sRGB), DCI, and BT2020 presented in Table 1 refer to a standard range of color gamut, which is defined as a triangle having upper left, lower left, and lower right vertices as green, blue, and red, respectively, in CIE1931 typically known. In the current display color standard of HDTV, the color gamut of the DCI is larger in area than that of the BT709, and the color gamut of the BT2020 is larger in area than that of the DCI. Each DCI has an excellent color gamut for movie display, and the BT2020 has a color gamut suitable for UHDTV.

Here, the overlap ratio refers to an overlap ratio with a color gamut triangle defined by each of BT709, DCI, and BT2020. The larger the overlap ratio, the better the corresponding color gamut condition. In the fifth Experimental Example Ex5, all the overlap ratios are about 97% or more, which means that excellent color display is possible.

Meanwhile, the material of the compensation pattern 170 used in the fifth experimental example Ex5 is SiNx.

SiNx is advantageous in that it has a refractive index of 1.9 to 2.0, a small variation in refractive index of about 0.1, and a small extinction coefficient in the band of visible light.

In addition, the anodes 110a and 110b are tested in common using ITO (Indium Tin Oxide). In the configuration in the stacks provided in the second and fifth experimental examples Ex2 and Ex5 and the fourth experimental example Ex4, the emission layers and the common layers are made of the same material, and all the organic stacks have a thickness within the range of 3800 Å to 4300 Å. These experimental examples are different in terms of the provision of the compensation pattern 170 of the white subpixel and the thickness of the anode.

TABLE 1

| | Structure | Ex4 | Ex2 | Ex1 |
|---|---|---|---|---|
| | Stack Structure | B1/RG/B2 | B1/B2/RG | B1/B2/RG |
| | Compensation Pattern | None | None | Provision (thickness: 900 Å) |
| Characteristic | Anode Thickness | 1200 Å | 1200 Å | 500 Å |
| FW Efficiency (Cd/A Comparison) | R | 100% | 140% | 153% |
| | G | 100% | 101% | 89% |
| | B | 100% | 100% | 105% |
| | W | 100% | 106% | 104% |
| Peak Efficiency of 25% (Cd/A Comparison) | R | 100% | 140% | 153% |
| | G | 100% | 101% | 89% |
| | B | 100% | 100% | 105% |
| | W | 100% | 106% | 104% |
| Δ color coordinate | Rx | 0.0000 | −0.005 | −0.003 |
| | Ry | 0.0000 | 0.003 | 0.000 |
| | Gx | 0.0000 | 0.000 | −0.010 |
| | Gy | 0.0000 | −0.001 | 0.014 |
| | Bx | 0.0000 | 0.000 | 0.002 |
| | By | 0.0000 | 0.000 | −0.002 |
| | Wx | 0.0000 | −0.019 | −0.030 |
| | Wy | 0.0000 | −0.004 | 0.006 |
| FW White Efficieny[nit] | | 100% | 107% | 105% |
| Peak White Efficiency of 25% [nit] | | 100% | 108% | 124% |
| BT709 (sRGB) | Area Ratio [%] | 98% | 100 | 97% |
| | Overlap Ratio [%] | 100% | 100% | 100% |
| DCI | Area Ratio [%] | 100% | 102% | 97% |
| | Overlap Ratio [%] | 100% | 100% | 100% |
| BT2020 | Area Ratio [%] | 100% | 102% | 97% |
| | Overlap Ratio [%] | 100% | 102% | 98% |
| Δu'v' at viewing angle of 60° | | — | +0.012 | 0 |

Figure 10:
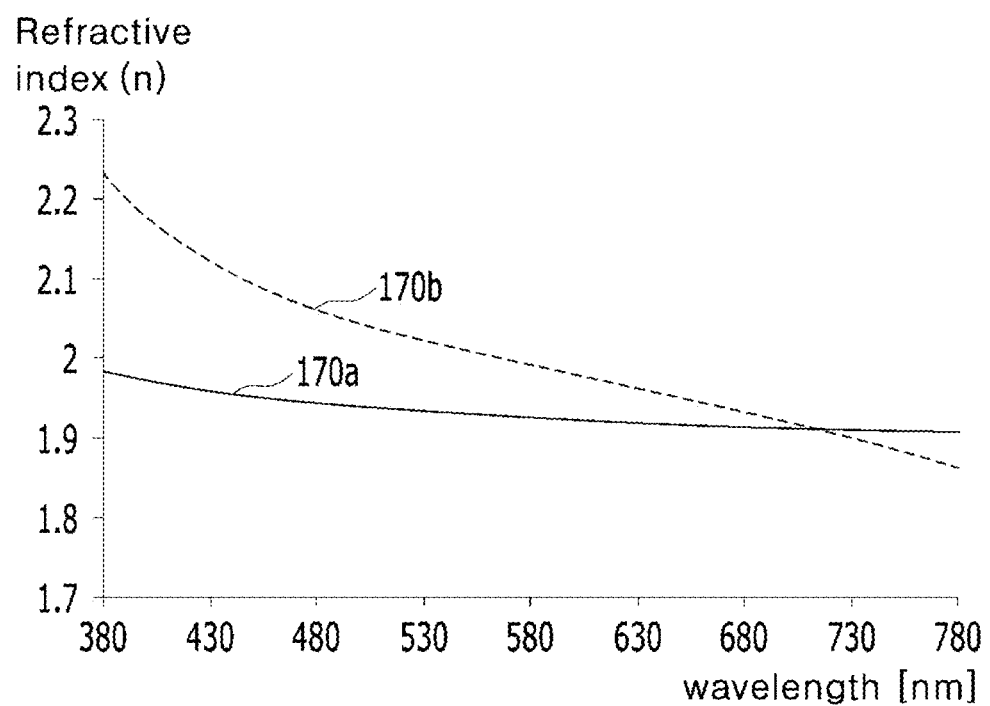
FIG. 10 is a graph illustrating a wavelength-dependent refractive index for each material of a viewing angle compensation pattern used in the display device of the present invention.
Figure 11:
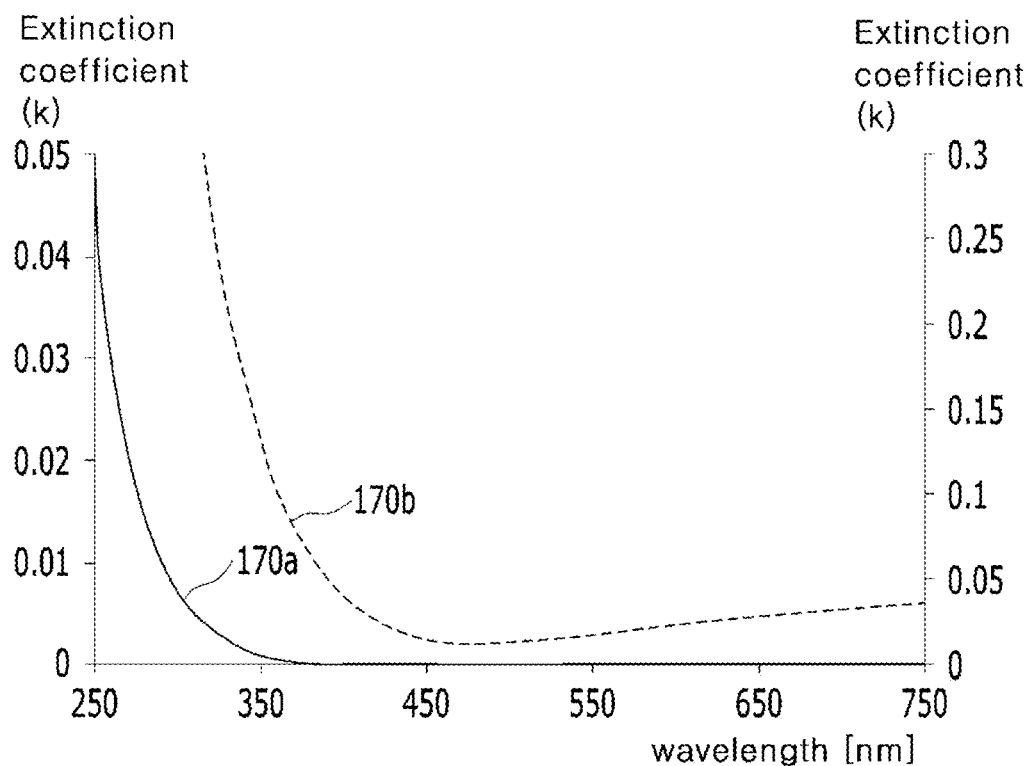
FIG. 11 is a graph illustrating an extinction coefficient for each material of the viewing angle compensation pattern used in the display device of the present invention.
Figure 12:
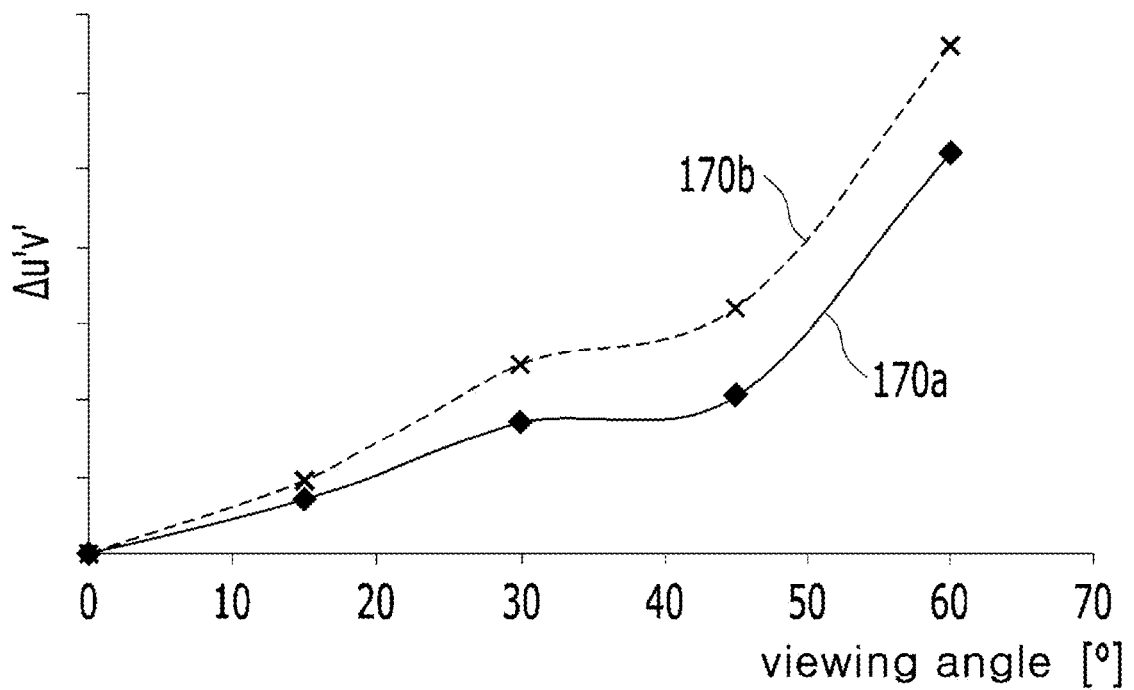
FIG. 12 is a graph illustrating a change in viewing angle for each material of the viewing angle compensation pattern used in the display device of the present invention.

FIG. 10 is a graph illustrating a wavelength-dependent refractive index for each material of the viewing angle compensation pattern used in the display device of the present invention. FIG. 11 is a graph illustrating an extinction coefficient for each material of the viewing angle compensation pattern used in the display device of the present invention. FIG. 12 is a graph illustrating a change in viewing angle for each material of the viewing angle compensation pattern used in the display device of the present invention.

FIGS. 10 and 11 illustrate that the refractive index (n) and extinction coefficient (k) of the compensation pattern vary depending on the first and second materials 170a and 170b thereof in the band of visible light.

SiNx in the fifth experimental example Ex5 is used as the first material 170a, and IZO (Indium Zinc Oxide) is used as the second material 170b.

It can be seen that the second material 170b has a variation in refractive index of 0.3 or more in the band of visible light (430 nm to 730 nm), whereas the first material 170a has a small variation in refractive index of 0.1 or less. Accordingly, when using the first material 170a, it can be expected that light passing through the second anode and the compensation pattern through the white organic light-emitting device exhibits stable transmission characteristics without changing refractive index between color wavelengths for a plurality of color wavelengths.

In FIG. 11, the extinction coefficient of the first material 170a is indicated by the left vertical axis, and the extinction coefficient of the second material 170b is indicated by the right vertical axis.

It can be seen that the second material 170b has a large variation in extinction coefficient of 0.02 to 0.04 in the band of visible light, whereas the first material 170a has a variation in extinction coefficient of almost 0 (zero). Thus, it can be seen that light passing through the second anode 110b passes through the compensation pattern 170 with almost no loss.

FIG. 12 illustrates an experiment in which the first material 170a and the second material 170b are used as the material of the compensation pattern in the structure of the display device of the fifth experimental example Ex5. When the second material 170b is used rather than the first material 170a, the color variation Δu'v' across viewing angles is large, Accordingly, it can be expected that the larger the viewing angle, the greater the color variation when the second material 170b is used.

As described above, the compensation pattern illustrated in FIG. 1 has an advantage when the first material 170a is used as the material thereof rather than the second material 170b.

Meanwhile, based on the structure of the fifth experimental example (see the structure of the display device illustrated in FIG. 1), in the white subpixel in which the second anode has a fixed thickness of 500 Å and the compensation pattern has different thicknesses of 700 Å, 1100 Å, and 100 Å, their efficiency, color coordinate, white efficiency in full white, peak white efficiency 25%, color gamut characteristics, and viewing angle characteristics will be described below.

The thickness of the compensation pattern is set to 700 Å, 800 Å, 900 Å, 1000 Å, and 1100 Å in the order of the sixth experimental example Ex6, the seventh experimental example Ex7, the fifth experimental example Ex5, the eighth experimental example Ex8, and the ninth experimental example Ex9.

Figure 13A:
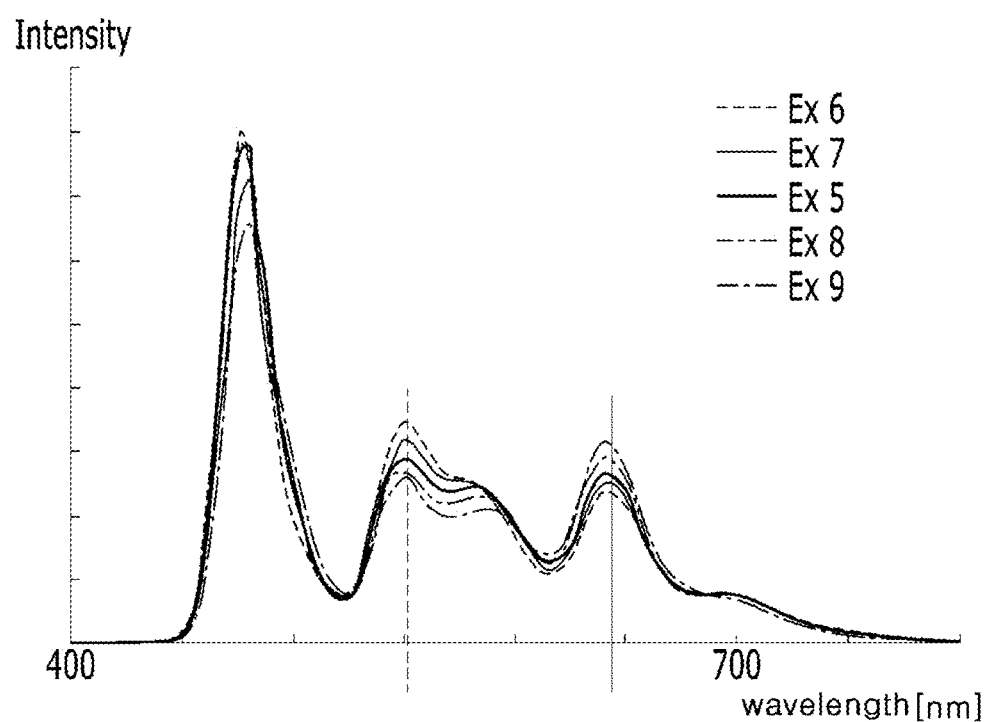
FIGS. 13A and 13B are graphs illustrating a white spectrum and an emittance spectrum when first anodes have different thicknesses in the fifth to ninth experimental examples of the display device of the present invention.
Figure 13B:
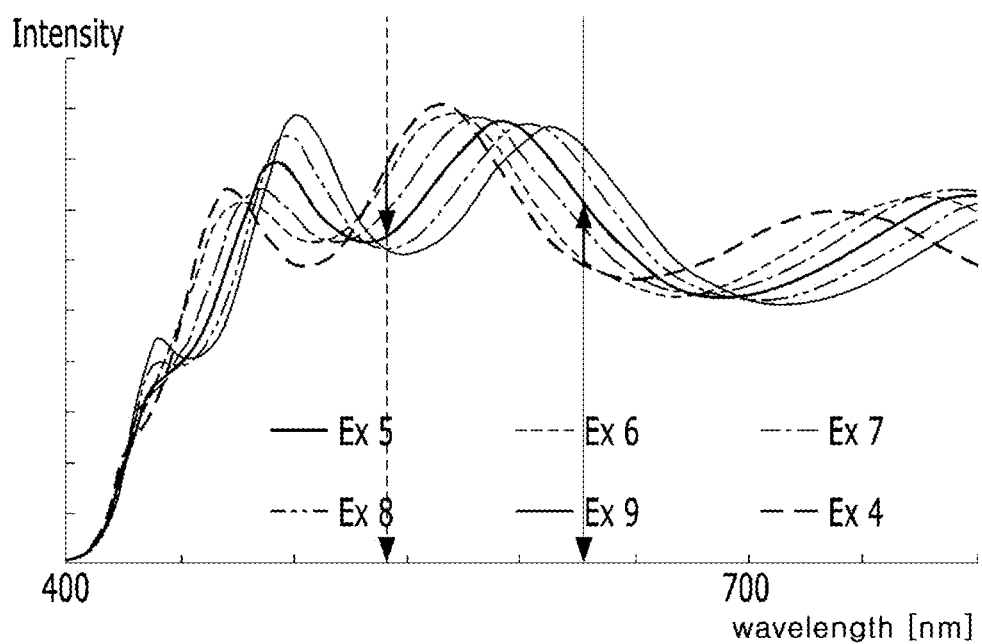

FIGS. 13A and 13B are graphs illustrating a white spectrum and an emittance spectrum when the first anodes have different thicknesses in the fifth to ninth experimental examples of the display device of the present invention.

In Table 2, each efficiency comparison value, color coordinate, and color variation Δu'v' at a viewing angle of 60 degrees are represented as a value compared to the fourth experimental example Ex4.

As indicated in Table 2, in all the fifth to ninth experimental examples having the compensation pattern beneath the thin second anode, it is confirmed that in the case of full white and peak efficiency of 25%, the effect of improving efficiency is large in red, and the effect of improving efficiency is also large in the remaining white as well as green and blue.

In the fifth experimental example Ex5, the pure green efficiency is lower than the fourth experimental example Ex4. However, in the data in Table 2 represented as a value compared to the fourth experimental example Ex4, the green efficiency in the fourth experimental example Ex4 is relatively high compared to the red efficiency, which causes a difference in color visibility across viewing angles. Even if the efficiency of green light emission is 89% in the fifth experimental example Ex5 presented in Table 2, this does not affect the green display and the efficiency of white light emission based thereon. In particular, it can be seen that both the FW white efficiency and the peak efficiency of 25% have a level of 104%, and the white efficiency is improved, compared to the fourth experimental example Ex4, by improving the efficiency of red and blue light emission.

In particular, considering the white efficiency in full white (FW) in terms of panel performance, the efficiency is 131% in the fifth experimental example Ex5 compared to the fourth experimental example Ex4.

TABLE 2

| | | Structure | | | | |
|---|---|---|---|---|---|---|
| | | Ex6 | Ex7 | Ex5 | Ex8 | Ex9 |
| Characteristic | Compensation Pattern [Å] | 700 | 800 | 900 | 1000 | 1100 |
| | Second anode [Å] | 500 | 500 | 500 | 500 | 500 |
| FW Efficiency (Cd/A Comparison) | R | 120% | 126% | 153% | 144% | 155% |
| | G | 117% | 111% | 89% | 98% | 94% |
| | B | 119% | 122% | 105% | 121% | 118% |
| | W | 108% | 107% | 104% | 103% | 101% |
| Peak Efficiency of 25% (Cd/A Comparison) | R | 138% | 144% | 153% | 165% | 177% |
| | G | 143% | 136% | 89% | 120% | 115% |
| | B | 127% | 130% | 105% | 129% | 125% |
| | W | 121% | 120% | 104% | 116% | 113% |
| Δ color coordinate | Rx | −0.001 | −0.001 | −0.003 | −0.001 | −0.001 |
| | Ry | 0.005 | 0.004 | 0.000 | 0.003 | 0.003 |
| | Gx | −0.006 | −0.011 | −0.010 | −0.011 | −0.006 |
| | Gy | 0.011 | 0.017 | 0.014 | 0.024 | 0.025 |
| | Bx | 0.000 | 0.000 | 0.002 | 0.002 | 0.003 |
| | By | −0.004 | −0.004 | −0.002 | −0.007 | −0.009 |
| | Wx | −0.013 | −0.016 | −0.030 | −0.030 | −0.039 |
| | Wy | 0.008 | 0.015 | 0.006 | 0.018 | 0.014 |
| FW White Efficiency [nit] | | 126% | 149% | 107% | 103% | 89% |
| Peak White Efficiency of 25% [nit] | | 162% | 191% | 108% | 132% | 114% |
| BT709 (sRGB) | Area Ratio [%] | 97% | 96% | 97% | 94% | 94% |
| | Overlap Ratio [%] | 100% | 100% | 100% | 100% | 100% |
| DCI | Area Ratio [%] | 97% | 96% | 97% | 94% | 94% |
| | Overlap Ratio [%] | 100% | 100% | 100% | 99% | 99% |
| BT2020 | Area Ratio [%] | 97% | 96% | 97% | 94% | 94% |
| | Overlap Ratio [%] | 99% | 98% | 98% | 97% | 96% |
| Δu'v' at viewing angle of 60° | | +0.003 | +0.004 | 0 | 0 | −0.002 |

As illustrated in FIGS. 13A and 13B, the change in emittance peak for the longer-wavelength emission stack including the red and green emission layers will be described. As the thickness of the compensation pattern increases (Sixth Experimental Example→Seventh Experiment Example→Fifth Experimental Example→Eighth Experimental Example→Ninth Experimental Example), the efficiency of red light emission is increased, but the efficiency of green light emission is decreased. In the case where the thickness of the compensation pattern is gradually thicker, the color temperature exceeds 10000K and deviates from the reference color coordinate when the white light is realized. When the thickness of the second anode 110b is approximately 500 Å and the thickness of the compensation pattern is 900 Å to 1000 Å, it can be seen that the color variation is reduced at a viewing angle of 60 degrees, the efficiency of red and green light emission is improved with similar balance, and the efficiency of white light emission is improved without color gamut concentration.

In addition, based on the structure of the fifth experimental example (see the structure of the display device illustrated in FIG. 1), in the white subpixel in which the compensation pattern has a fixed thickness of 900 Å and the second anode has different thicknesses of 300 Å, 700 Å, and 100 Å, their efficiency, color coordinate, white efficiency in full white, peak white efficiency 25%, color gamut characteristics, and viewing angle characteristics will be described below.

The thickness of the second anode is set to 300 Å, 400 Å, 500 Å, 600 Å, and 700 Å in the order of the tenth experimental example Ex10, the eleventh experimental example Ex11, the fifth experimental example Ex5, the twelfth experimental example Ex12, and the thirteenth experimental example Ex13.

Figure 14A:
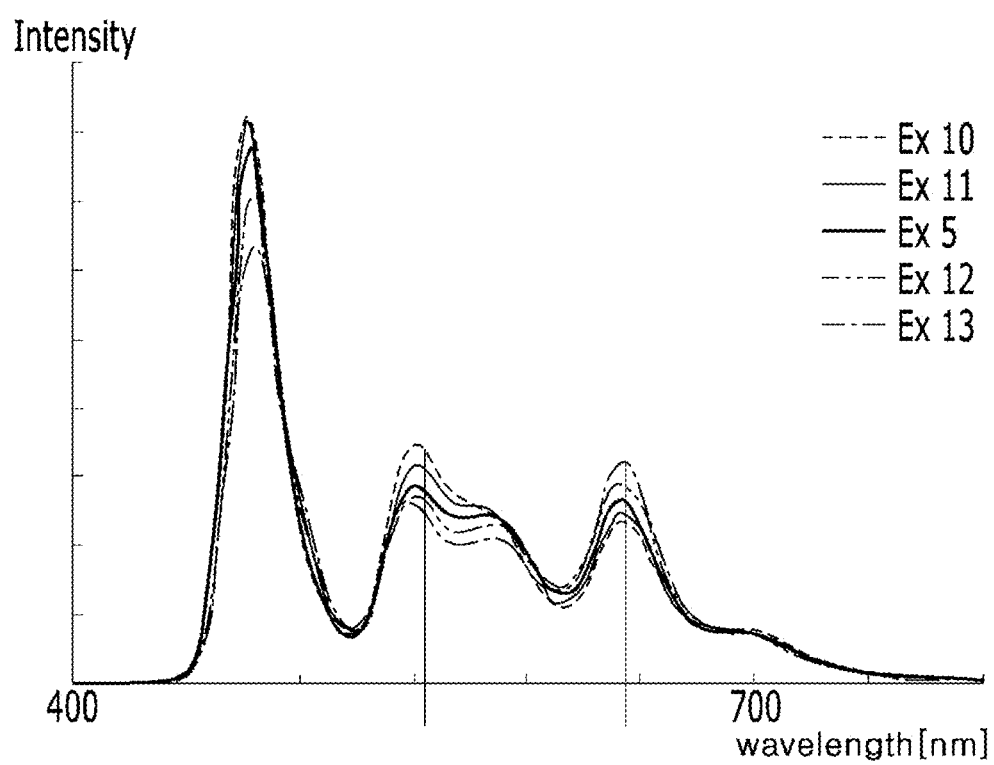
FIGS. 14A and 14B are graphs illustrating a white spectrum and an emittance spectrum when viewing angle compensation patterns have different thicknesses in the fifth and tenth to thirteenth experimental examples of the display device of the present invention.
Figure 14B:
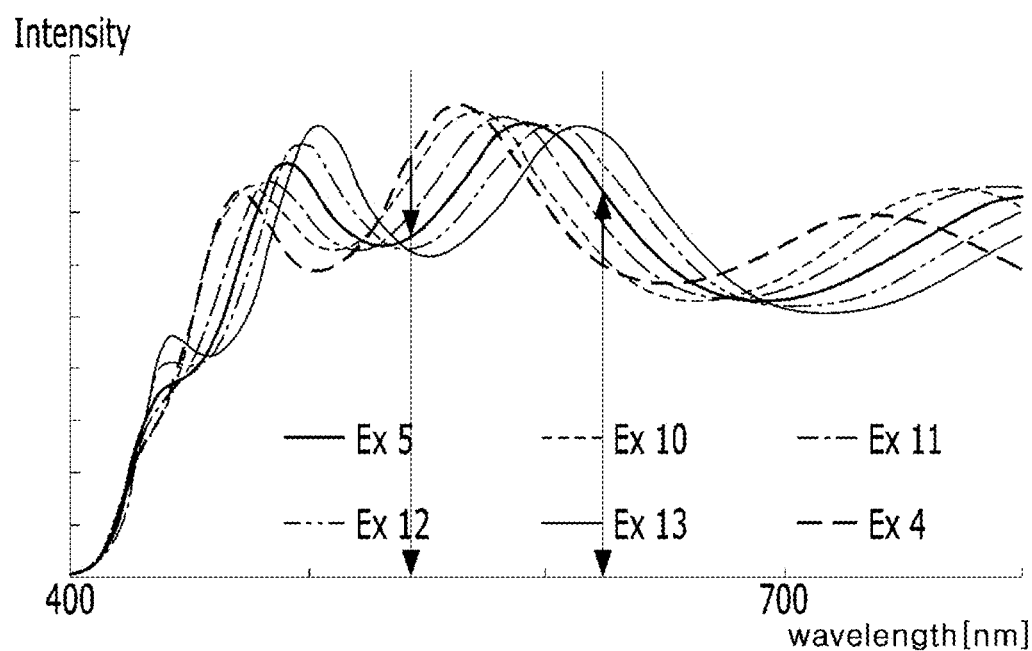

FIGS. 14A and 14B are graphs illustrating a white spectrum and an emittance spectrum when the viewing angle compensation patterns have different thicknesses in the fifth and tenth to thirteenth experimental examples of the display device of the present invention.

In Table 3, each efficiency comparison value, color coordinate, and color variation Δu'v' at a viewing angle of 60 degrees are represented as a value compared to the fourth experimental example Ex4.

As indicated in Table 3, in all the fifth and tenth to thirteenth experimental examples having the second anode and the compensation pattern beneath the second anode, it is confirmed that in the case of full white and peak efficiency of 25%, the effect of improving efficiency is large in red, and the effect of improving efficiency is also large in the remaining white as well as green and blue.

In the fifth experimental example Ex5, the pure green efficiency is lower than the fourth experimental example Ex4. However, in the data in Table 2 represented as a value compared to the fourth experimental example Ex4, the green efficiency in the fourth experimental example Ex4 is relatively high compared to the red efficiency, which causes a difference in color visibility across viewing angles. Even if the efficiency of green light emission is 89% in the fifth experimental example Ex5 presented in Table 3, this does not affect the green display and the efficiency of white light emission based thereon. In particular, it can be seen that both the FW white efficiency and the peak efficiency of 25% have a level of 104%, and the white efficiency is improved, compared to the fourth experimental example Ex4, by improving the efficiency of red and blue light emission.

TABLE 3

| | | Structure | | | | |
|---|---|---|---|---|---|---|
| | | Ex10 | Ex11 | Ex5 | Ex12 | Ex13 |
| Characteristic | Compensation Pattern [Å] | 900 | 900 | 900 | 900 | 900 |
| | Second anode [Å] | 300 | 400 | 500 | 600 | 700 |
| FW Efficiency (Cd/A Comparison) | R | 120% | 126% | 153% | 144% | 156% |
| | G | 117% | 111% | 89% | 99% | 95% |
| | B | 121% | 123% | 105% | 120% | 115% |
| | W | 108% | 107% | 104% | 103% | 101% |
| Peak Efficiency of 25% (Cd/A Comparison) | R | 137% | 144% | 153% | 166% | 179% |
| | G | 142% | 135% | 89% | 121% | 116% |
| | B | 129% | 131% | 105% | 128% | 123% |
| | W | 121% | 120% | 104% | 116% | 114% |
| Δ color coordinate | Rx | −0.001 | −0.001 | −0.003 | −0.001 | −0.001 |
| | Ry | 0.005 | 0.004 | 0.000 | 0.003 | 0.003 |
| | Gx | −0.006 | −0.011 | −0.010 | −0.011 | −0.005 |
| | Gy | 0.011 | 0.017 | 0.014 | 0.024 | 0.024 |
| | Bx | −0.001 | 0.000 | 0.002 | 0.002 | 0.003 |
| | By | −0.003 | −0.003 | −0.002 | −0.007 | −0.009 |
| | Wx | −0.010 | −0.015 | −0.030 | −0.032 | −0.041 |
| | Wy | 0.013 | 0.018 | 0.006 | 0.015 | 0.011 |
| FW White Efficiency [nit] | | 133% | 152% | 107% | 101% | 87% |
| Peak White Efficiency of 25% [nit] | | 145% | 166% | 108% | 110% | 95% |
| BT709 (sRGB) | Area Ratio [%] | 98% | 96% | 97% | 94% | 94% |
| | Overlap Ratio [%] | 100% | 100% | 100% | 100% | 100% |
| DCI | Area Ratio [%] | 98% | 96% | 97% | 94% | 94% |
| | Overlap Ratio [%] | 100% | 99% | 100% | 99% | 99% |
| BT2020 | Area Ratio [%] | 99% | 96% | 97% | 94% | 94% |
| | Overlap Ratio [%] | 99% | 98% | 98% | 97% | 96% |
| Δu'v' at viewing angle of 60° | | +0.007 | +0.002 | 0 | −0.002 | −0.003 |

As illustrated in FIGS. 14A and 14B, the change in emittance peak for the longer-wavelength emission stack including the red and green emission layers will be described. As the thickness of the second anode increases (tenth Experimental Example→Eleventh Experiment Example→Fifth Experimental Example→Twelfth Experimental Example→Thirteenth Experimental Example), the efficiency of red light emission is increased, but the efficiency of green light emission is decreased. In the case where the thickness of the compensation pattern is gradually thicker, the color temperature exceeds 10000K and deviates from the reference color coordinate when the white light is realized.

When the thickness of the compensation pattern is approximately 900 Å and the thickness of the second anode is 500 Å to 600 Å, it can be seen that the color variation is reduced at a viewing angle of 60 degrees, the efficiency of red and green light emission is improved with similar balance, and the efficiency of white light emission is improved without color gamut concentration.

Figure 15:
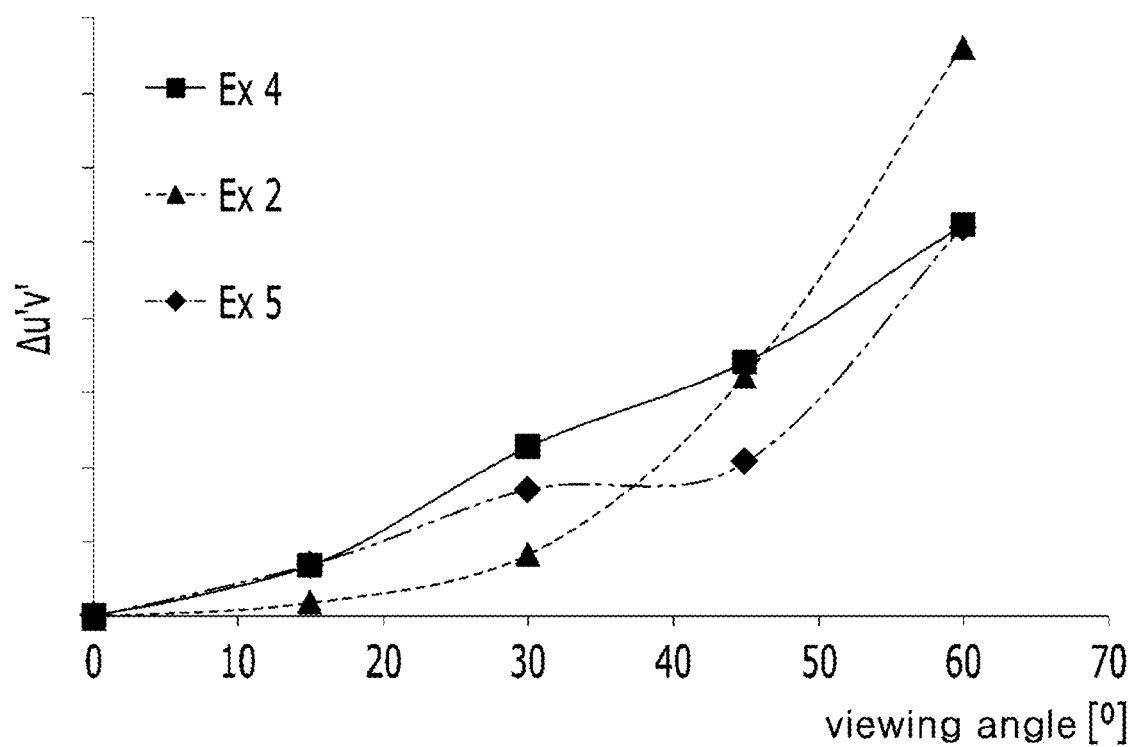
FIG. 15 is a graph illustrating viewing angle characteristics in the second, fourth, and fifth experimental examples.

FIG. 15 is a graph illustrating viewing angle characteristics in the second, fourth, and fifth experimental examples.

Referring to FIG. 15, the change in color variation Δu'v' when the viewing angle is changed from 0 to 60 degrees will be described. In the second experimental example Ex2, it can be seen that the color variation Δu'v' across viewing angles is sharply changed.

In the fourth and fifth experimental examples Ex4 and Ex5, compared to the second experimental example Ex2, it can be seen that the change in color variation Δu'v' across viewing angles is reduced. In addition, compared to the fourth experimental example Ex4, the fifth experimental example Ex5 shows that the change in color variation Δu'v' is relatively gentle when the viewing angle changes from 0 to 45 degrees, and the color variation Δu'v' is small at a viewing angle of 45 to 60 degrees. Thus, it can be expected that the display device to which the fifth experimental example Ex5 has little color variation at least up to the viewing angle of 45 degrees, together with the above-mentioned increase in luminous efficiency, and has less recognition change up to the viewing angle of 60 degrees, compared to the fourth experimental example. When the viewer substantially views the display device, the viewing angle is rarely more than 45 degrees. Therefore, in practical use, the fifth experimental example to which the display device structure of the present invention is applied is effective in that there is almost no color difference due to a change in viewing angle.

Figure 16:
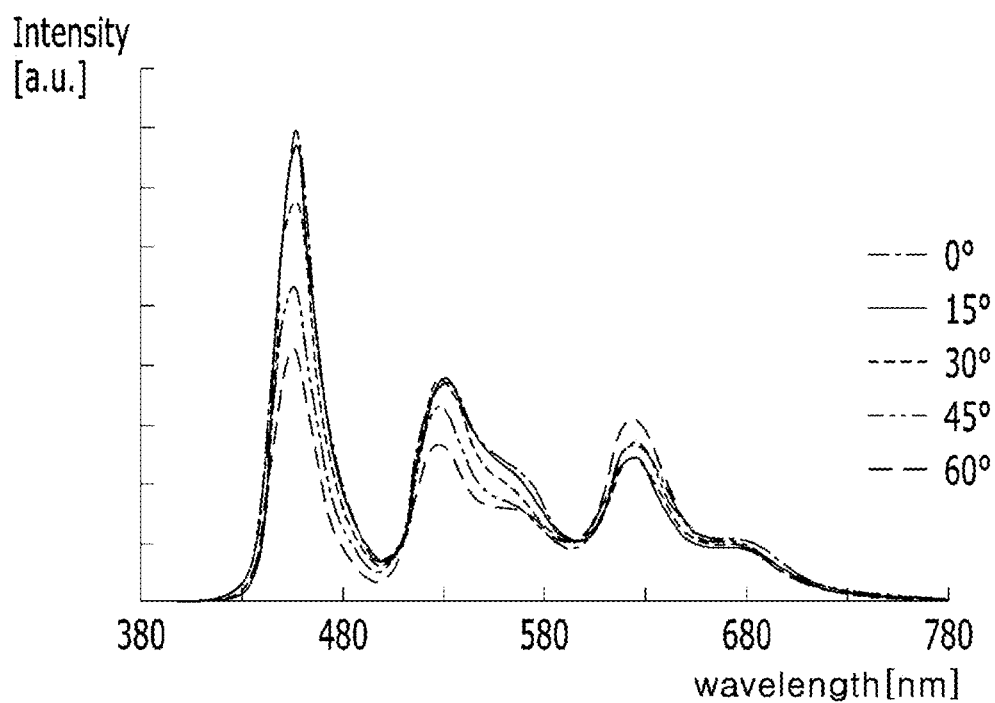
FIG. 16 is a graph illustrating a white spectrum according to the viewing angle in the fourth experimental example.
Figure 17:
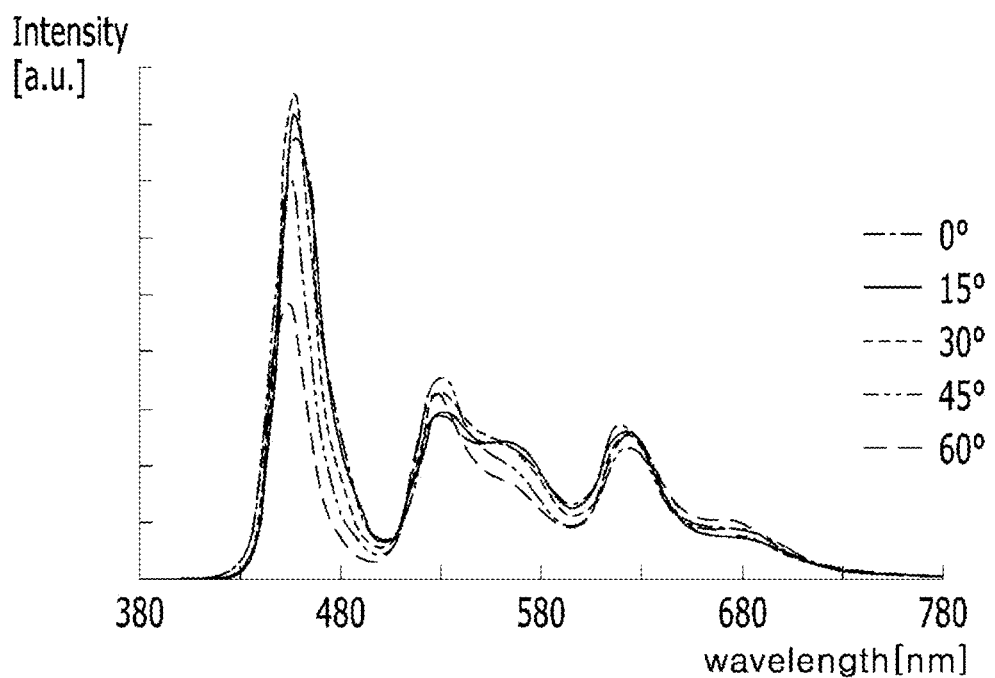
FIG. 17 is a graph illustrating a white spectrum according to the viewing angle in the fifth experimental example.

FIG. 16 is a graph illustrating a white spectrum according to the viewing angle in the fourth experimental example. FIG. 17 is a graph illustrating a white spectrum according to the viewing angle in the fifth experimental example.

As illustrated in FIGS. 16 and 17, it can be seen that in the fifth experimental example compared to the fourth experimental example, the intensity variation is small according to the change in viewing angle (0 to 60 degrees) for green and red light.

In the above-mentioned display device according to the first embodiment (fifth experimental example) of the present invention, the first anodes of the colored subpixels R_SP, G_SP, and B_SP have the same thickness and the second anode of the white subpixel W_SP is thinner than the first anodes.

In this case, this structure has been described in which the organic stack OS consists of the first blue emission stack, the second blue emission stack, and the longer-wavelength emission stack between the first and second anodes 110a and 110b and the cathode 120 in order to improve the overall efficiency of white light emission by compensating for the efficiency of red light emission.

Hereinafter, a structure will be described in which first anodes in colored subpixels have different thicknesses in a second embodiment.

Figure 18:
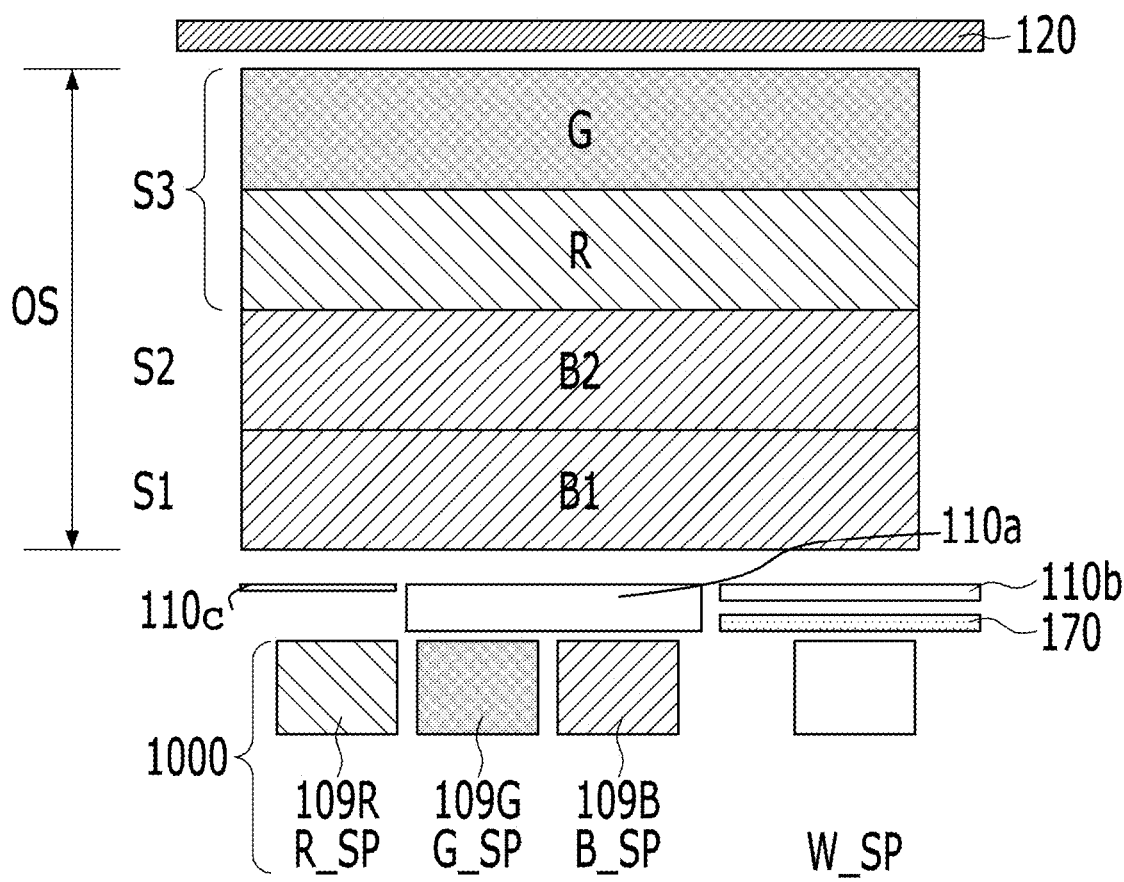
FIG. 18 is a cross-sectional view schematically illustrating a display device according to a second embodiment of the present invention.

FIG. 18 is a cross-sectional view schematically illustrating a display device according to a second embodiment of the present invention.

As illustrated in FIG. 18, the display device according to the second embodiment of the present invention includes a substrate 1000 having at least two colored subpixels R_SP, G_SP, and B_SP and a white subpixel W_SP separately arranged thereon, a first anode 110a having a first thickness t1 provided in each of the green and blue subpixels G_SP and B_SP of the substrate, a second anode 110b having a second thickness t2, which is smaller than the first thickness, provided in the white subpixel W_SP of the substrate, and a third anode 110c having a third thickness, which is smaller than that of the white subpixel W_SP, provided in the red subpixel R_SP.

Since an organic stack OS and a cathode 120 formed on the first to third anodes 110a, 110b, and 110c are the same as those illustrated in FIG. 2, a description thereof will be omitted.

Here, the thinnest third anode 110c in the red subpixel R_SP is provided to increase a relatively low transmittance of red light.

The display device according to the second embodiment is also characterized in that the first and second stacks S1 and S2 emitting blue light are adjacent to the first to third anodes 110a, 110b, and 110c, and the third stack S3, emitting long-wavelength light, is adjacent to the cathode 120 in order to improve luminous efficiency without changing any material within the organic light-emitting device.

In a display device including two blue emission stacks and a longer-wavelength emission stack, when the longer-wavelength emission stack is positioned as an intermediate stack between an anode and a cathode, the efficiency of long-wavelength light emission may decrease. However, when the third stack S3 is provided as a longer-wavelength emission stack adjacent to the cathode as in the display device of the present invention, the efficiency of long-wavelength light emission can remarkably increase without changing the material. Therefore, the display device of the present invention has an advantage of increasing color efficiency of long-wavelength light merely by changing the stacks, without changing green, red, or yellow-green dopants or without additional material development.

The structural effects of the display device according to the second embodiment of the present invention will be described.

The second experimental example is set to a fourteenth experimental example Ex14, the third anode 110c of the red subpixel R_SP has a thickness of 300 Å, and the remaining configuration is the same as the fifth experimental example Ex5.

Although the efficiency of R, G, B, and W for each subpixel is evaluated, the efficiency of the subpixel of the corresponding color will substantially influence the efficiency of panel performance. Through Table 4, it can be seen that the fourteenth Experimental Example Ex14 exhibits an excellent effect of increasing the efficiency of red light emission. In addition, the green, blue, and white subpixels G_SP, B_SP, and W_SP are the same as the fifth Experimental Example Ex5, which exhibits both high luminous efficiency and viewing angle characteristics. Thus, it can be confirmed that the panel performance is improved in the colored subpixels other than red and white subpixel. In particular, based on the fourth experimental example Ex4, it can be seen that all the color gamut overlap ratios in BT709, DCI, and BT2020 are increased, and there is no color variation at a viewing angle of 60 degrees as in the fourth experimental example Ex4.

TABLE 4

|  |  | Structure | | | | |
| --- | --- | --- | --- | --- | --- | --- |
|  |  | Ex4 | Ex14 | | | |
| Characteristic |  |  |  |  |  |  |
|  | Stack Structure | B1/RG/B2 | B1/B2/RG | | | |
|  | Subpixel | RBGW | R | BG | W | Panel |
|  | Anode Thickness | 1200 Å | 300 Å | 1200 Å | 500 Å | Performance |
|  | Compensation Pattern | None | None | None | Provision | mance |
| FW Efficiency | R | 100% | 160% | 140% | 153% | 160% |
| (Cd/A | G | 100% | 90% | 101% | 89% | 101% |
| Comparison) | B | 100% | 124% | 100% | 105% | 100% |
|  | W | 100% | 96% | 106% | 104% | 104% |
| Peak | R | 100% | 160% | 140% | 153% | 161% |
| Efficiency of | G | 100% | 97% | 101% | 89% | 101% |
| 25% (Cd/A | B | 100% | 115% | 100% | 105% | 105% |
| Comparison) | W | 100% | 94% | 106% | 104% | 104% |
| Δ color | Rx | 0.0000 | −0.003 | −0.005 | −0.003 | −0.03 |
| coordinate | Ry | 0.0000 | 0.004 | 0.003 | 0.000 | 0.004 |
|  | Gx | 0.0000 | 0.004 | 0.000 | −0.010 | 0.000 |
|  | Gy | 0.0000 | 0.017 | −0.001 | 0.014 | −0.001 |
|  | Bx | 0.0000 | 0.002 | 0.000 | 0.002 | 0.000 |
|  | By | 0.0000 | −0.005 | 0.000 | −0.002 | 0.000 |
|  | Wx | 0.0000 | −0.027 | −0.019 | −0.030 | −0.030 |
|  | Wy | 0.0000 | 0.038 | −0.004 | 0.006 | 0.006 |
| FW White Efficiency [nit] |  | 100% | 114% | 138% | 128% | 131% |
| BT709 (sRGB) | Area Ratio [%] | 100% |  |  |  | 100% |
|  | Overlap Ratio [%] | 100% |  |  |  | 100% |
| DCI | Area Ratio [%] | 100% |  |  |  | 102% |
|  | Overlap Ratio [%] | 100% |  |  |  | 100% |
| BT2020 | Area Ratio [%] | 100% |  |  |  | 102% |
|  | Overlap Ratio [%] | 100% |  |  |  | 101% |
| Δu'v' at viewing angle of 60° |  | 0.000 | −0.009 | −0.001 | 0.000 | 0.000 |

Through the display device according to the above fourteenth experimental example (second embodiment of the present invention), it can be confirmed that the synergistic effect on red luminance is excellent, and in particular, the color efficiency for red, green, blue, and white is improved by 1% to 60%.

In the display device according to the second embodiment, in order to easily form the first anodes of the green and blue subpixels G_SP and B_SP to have the same thickness, these green subpixel G_SP and blue subpixel B_SP may be preferably located adjacent to each other.

The display device of the present invention is a structure capable of improving pure red efficiency and improving color gamut, without changing the entire thickness of the organic material or any material, by selectively providing the white subpixel with the compensation pattern capable of compensating for the anode and the viewing angle. It is possible to first improve the efficiency of the display device in the order of the stacks and to relieve the color variation across viewing angles by providing the white subpixel with the compensation pattern. Since the change in viewing angle is problematic in the white subpixel rather than the colored subpixels, the compensation pattern is selectively provided only in the white subpixel.

In the structure in which the two or more blue emission stacks and the longer-wavelength emission stack are provided between the anode and the cathode, the display device of the present invention is configured such that the longer-wavelength emission stack is provided adjacent to the cathode, improving the efficiency of long-wavelength light emission.

In addition, the display device of the present invention includes the compensation pattern, which is capable of adjusting the thickness of the anode of the white subpixel and compensating for the viewing angle, in order to resolve the difference in color variation between red and green due to the change in viewing angle that may occur when the stack is simply changed. Since the change in viewing angle is problematic in the white subpixel rather than the colored subpixels, the compensation pattern is selectively provided only in the white subpixel.

In particular, it is possible to improve the transmittance of the white subpixel since the anode in the white subpixel is thinner compared to the anodes of the other colored subpixels.

In another embodiment, the anodes of the colored subpixels have different thicknesses. Therefore, by reducing the thickness of the anode of any colored subpixel with relatively low efficiency, the luminous efficiency thereof can be improved.

Ultimately, the display device of the present invention is a structure capable of improving pure red efficiency and improving color gamut, without changing the entire thickness of the organic material or any material.

A display device according to an embodiment of the present invention may include a substrate having at least two colored subpixels and a white subpixel separately arranged thereon, a first anode having a first thickness provided in each of the colored subpixels on the substrate, a second anode, having a thickness smaller than the first thickness, provided in the white subpixel on the substrate, an organic stack including a first stack having a first blue emission layer, a second stack having a second blue emission layer, and a third stack having at least one of emission layers having a longer wavelength than the blue emission layers, which are provided in sequence on the first anode in the colored subpixel and the second anode in the white subpixel, a cathode provided on the organic stack, and a compensation pattern provided between the second anode and the substrate.

The compensation pattern may have a refractive index of 1.9 to 2.0 at a wavelength of visible light.

The compensation pattern may have a variation in refractive index of 0.1 or less at a wavelength of visible light.

The compensation pattern may have an extinction coefficient of 0.01 or less at a wavelength of visible light.

The compensation pattern may include a silicon nitride film.

The compensation pattern may have a second thickness smaller than the first thickness and larger than the thickness of the second anode.

The thickness of the second anode may be 500 Å to 600 Å, and the thickness of the compensation pattern may be 900 Å to 1000 Å.

The first anode may be at least twice as thick as the second anode, and may be thinner than the total thickness of the second anode and the compensation pattern.

The first and second anodes may be transparent oxide electrodes containing at least two of indium (In), tin (Sn), and zinc (Zn), and the cathode may contain reflective metal.

The colored subpixels of the substrate may consist of first to third colored subpixels including a red filter, a green filter, and a blue filter, respectively.

The colored subpixels of the substrate may consist of first and second colored subpixels including a green filter and a blue filter, respectively.

The substrate may further include a red subpixel on the same plane as the first and second colored subpixels and the white subpixel.

The red subpixel may include a third anode thinner than the second anode.

The third stack may include a red emission layer and a green emission layer in contact with each other.

The third stack may include a yellow-green emission layer.

Each of the first to third colored subpixels may include at least one first thin film transistor connected to the first anode. The white subpixel may include at least one second thin film transistor connected to the second anode.

The display device may include a first common layer between the first and second anodes and the first blue emission layer, a second common layer between the first blue emission layer and the second blue emission layer, a third common layer between the second blue emission layer and the longer-wavelength emission layer, and a fourth common layer between the longer-wavelength emission layer and the cathode. The third common layer may be thinner than the second common layer.

As is apparent from the above description, the display device including a white organic light-emitting device according to the present invention has the following effects.

In the structure in which the two or more blue emission stacks and the longer-wavelength emission stack are provided between the anode and the cathode, the display device of the present invention is configured such that the longer-wavelength emission stack is provided adjacent to the cathode, improving the efficiency of long-wavelength light emission.

In addition, the display device of the present invention includes the compensation pattern, which is capable of adjusting the thickness of the anode of the white subpixel and compensating for the viewing angle, in order to resolve the difference in color variation between red and green due to the change in viewing angle that may occur when the stack is simply changed. Since the change in viewing angle is problematic in the white subpixel rather than the colored subpixels, the compensation pattern is selectively provided only in the white subpixel.

Ultimately, the display device of the present invention is a structure capable of improving pure red efficiency and improving color gamut, without changing the entire thickness of the organic material or any material.

It will be apparent to those skilled in the art that various modifications and variations can be made in the present disclosure without departing from the spirit or scope of the disclosure. Thus, it is intended that the present disclosure covers such modifications and variations to this invention provided they fall within the scope of the appended claims and their equivalents.

What is claimed is:

1. A display device, comprising:
   a substrate having at least two colored subpixels and a white subpixel separately arranged thereon;
   a first anode having a first thickness at each of the colored subpixels on the substrate;
   a second anode, having a thickness smaller than the first thickness, at the white subpixel on the substrate;
   an organic stack comprising a first stack having a first blue emission layer, a second stack having a second blue emission layer, and a third stack having at least one of emission layers having a longer wavelength than the first blue emission layer and the second blue emission layer, the first stack, the second stack and the third stack are provided in sequence on the first anode at the colored subpixel and the second anode at the white subpixel;
   a cathode over the organic stack; and
   a compensation pattern between the second anode and the substrate.

2. The display device according to claim 1, wherein the compensation pattern has a refractive index of 1.9 to 2.0 at a wavelength of visible light.

3. The display device according to claim 1, wherein the compensation pattern has a variation in refractive index of 0.1 or less at a wavelength of visible light.

4. The display device according to claim 1, wherein the compensation pattern has an extinction coefficient of 0.01 or less at a wavelength of visible light.

5. The display device according to claim 1, wherein the compensation pattern includes a silicon nitride film.

6. The display device according to claim 1, wherein the compensation pattern has a second thickness smaller than the first thickness and larger than the thickness of the second anode.

7. The display device according to claim 6, wherein:
   the thickness of the second anode is 500 Å to 600 Å; and
   the second thickness of the compensation pattern is 900 Å to 1000 Å.

8. The display device according to claim 7, wherein the first anode is at least twice as thick as the second anode, and is thinner than a total thickness of the second anode and the compensation pattern.

9. The display device according to claim 1, wherein:
   the first and second anodes are transparent oxide electrodes containing at least two of indium (In), tin (Sn), and zinc (Zn); and
   the cathode includes reflective metal.

10. The display device according to claim 1, wherein the colored subpixels of the substrate include first to third colored subpixels comprising a red filter, a green filter, and a blue filter, respectively.

11. The display device according to claim 10, wherein:
    each of the first to third colored subpixels comprises at least one first thin film transistor connected to the first anode; and
    the white subpixel comprises at least one second thin film transistor connected to the second anode.

12. The display device according to claim 1, wherein the colored subpixels of the substrate include first and second colored subpixels comprising a green filter and a blue filter, respectively.

13. The display device according to claim 12, wherein the substrate further comprises a red subpixel on the same plane as the first and second colored subpixels and the white subpixel.

14. The display device according to claim 13, wherein the red subpixel comprises a third anode thinner than the second anode.

15. The display device according to claim 1, wherein the third stack comprises a red emission layer and a green emission layer in contact with each other.

16. The display device according to claim 1, wherein the third stack comprises a yellow-green emission layer.

17. The display device according to claim 1, comprising:
    a first common layer between the first and second anodes and the first blue emission layer;
    a second common layer between the first blue emission layer and the second blue emission layer;
    a third common layer between the second blue emission layer and the longer-wavelength emission layer; and
    a fourth common layer between the longer-wavelength emission layer and the cathode,
    wherein the third common layer is thinner than the second common layer.

* * * * *